(12) United States Patent
Eimori et al.

(10) Patent No.: US 6,573,171 B2
(45) Date of Patent: Jun. 3, 2003

(54) SEMICONDUCTOR DEVICE AND MANUFACTURING PROCESS THEREOF

(76) Inventors: Takahisa Eimori, c/o Mitsubishi Denki Kabushiki Kaisha 2-3, Marunouchi 2-chome, Chiyoda-ku, Tokyo 100 (JP); Hiroshi Kimura, c/o Mitsubishi Denki Kabushiki Kaisha 2-3, Marunouchi 2-chome, Chiyoda-ku, Tokyo 100 (JP)

(*) Notice: Subject to any disclaimer, the term of this patent is extended or adjusted under 35 U.S.C. 154(b) by 0 days.

(21) Appl. No.: 09/760,641

(22) Filed: Jan. 17, 2001

(65) Prior Publication Data

US 2001/0002070 A1 May 31, 2001

Related U.S. Application Data

(60) Continuation of application No. 09/283,752, filed on Apr. 2, 1999, now Pat. No. 6,268,278, which is a division of application No. 08/687,624, filed on Jul. 26, 1996, now Pat. No. 6,087,710.

(30) Foreign Application Priority Data

Jan. 26, 1996 (JP) ................................................ 8-11624

(51) Int. Cl.[7] ..................... H01L 21/3205; H01L 21/44; H01L 21/4763; H01L 21/302
(52) U.S. Cl. ..................... 438/624; 438/586; 438/595; 438/597; 438/637; 438/735; 438/738; 438/740
(58) Field of Search ................................. 438/586, 588, 438/595, 597, 598, 621, 624, 639–640, 735, 738, 740

(56) References Cited

U.S. PATENT DOCUMENTS

| | | | |
|---|---|---|---|
| 4,601,939 A | 7/1986 | Gati et al. | 428/161 |
| 4,618,878 A | 10/1986 | Aoyama et al. | 357/71 |
| 4,665,426 A | 5/1987 | Allen et al. | 357/54 |
| 4,686,000 A | 8/1987 | Heath | 156/643 |
| 4,723,197 A | 2/1988 | Takiar et al. | 361/403 |
| 4,884,120 A | 11/1989 | Mochizuki et al. | 357/68 |
| 4,997,790 A | 3/1991 | Woo et al. | 438/586 |
| 5,010,039 A | 4/1991 | Ku et al. | 438/702 |
| 5,177,588 A | 1/1993 | Ii et al. | 257/640 |
| 5,200,358 A | 4/1993 | Bollinger et al. | 438/631 |
| 5,206,187 A | 4/1993 | Doan et al. | 438/618 |

(List continued on next page.)

FOREIGN PATENT DOCUMENTS

| | | |
|---|---|---|
| DE | 43 37 355 A1 | 5/1995 |
| EP | 0 529 717 A2 | 3/1993 |
| JP | 4-130722 | 5/1992 |
| JP | 5-218211 | 8/1993 |
| JP | 5-226333 | 9/1993 |
| JP | 05226333 | 9/1993 |
| JP | 5-343636 | 12/1993 |
| JP | 6-177265 | 6/1994 |

OTHER PUBLICATIONS

T. Ema et al., "3–Dimensional Stacked Capacitor Cell for 16M and 64M DRAMS", IEEE, 1988, pp. 592–595.

K.H. Kusters et al., "A High Density 4Mbit dRAM Process Using a Fully Overlapping Bitline Contact (FOBIC) Trench Cell", pp. 93–94.

*Primary Examiner*—Ha Tran Nguyen

(57) ABSTRACT

In a peripheral circuit region requiring a conductive path between layers at the periphery of a memory cell array region, a conductive path is provided, after removing a silicon nitride film used for self-alignment contact from the area of the contacting portion of a conductor, by forming an interlayer oxide film on the conductor and providing an opening through the interlayer oxide film. Alternatively, a conductive path is provided, after forming the interlayer oxide film on the silicon nitride film used for self-alignment contact, by forming an opening throughout the interlayer oxide film and silicon nitride film.

3 Claims, 31 Drawing Sheets

U.S. PATENT DOCUMENTS

| | | | |
|---|---|---|---|
| 5,258,645 A | 11/1993 | Sato | 257/637 |
| 5,270,240 A | 12/1993 | Lee | 438/257 |
| 5,298,463 A | 3/1994 | Sandhu et al. | 438/620 |
| 5,306,946 A | 4/1994 | Yamamoto | 257/640 |
| 5,319,246 A | 6/1994 | Nagamine et al. | 257/758 |
| 5,324,974 A | 6/1994 | Liao | 257/344 |
| 5,380,680 A | 1/1995 | Choi | 438/620 |
| 5,384,287 A | 1/1995 | Fukase | 438/303 |
| 5,410,185 A | 4/1995 | Yeh | 257/776 |
| 5,427,982 A | 6/1995 | Jun | 438/624 |
| 5,439,846 A | 8/1995 | Nguyen et al. | 438/453 |
| 5,578,524 A | 11/1996 | Fukase et al. | 438/624 |
| 5,723,380 A | 3/1998 | Wang et al. | 438/628 |
| 5,741,741 A * | 4/1998 | Tseng | 438/637 |
| 5,877,081 A | 3/1999 | Matsumoto et al. | 438/624 |

* cited by examiner

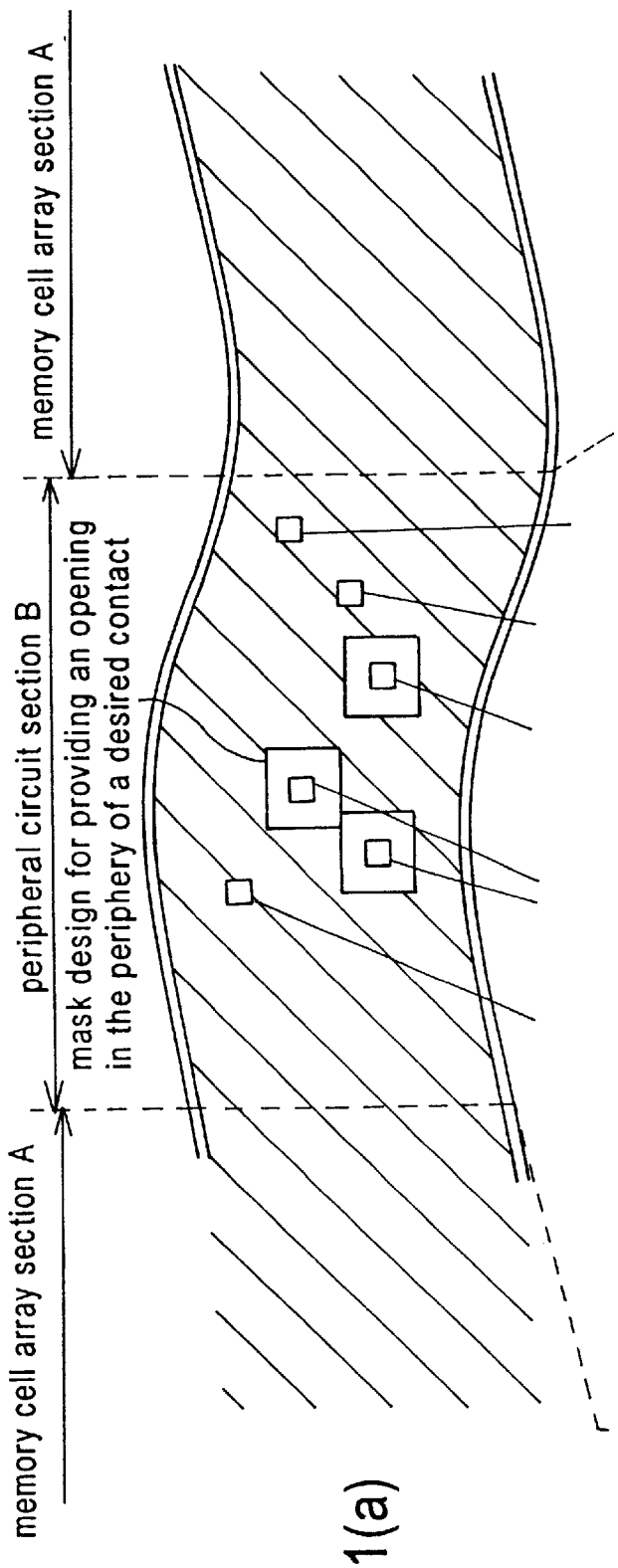
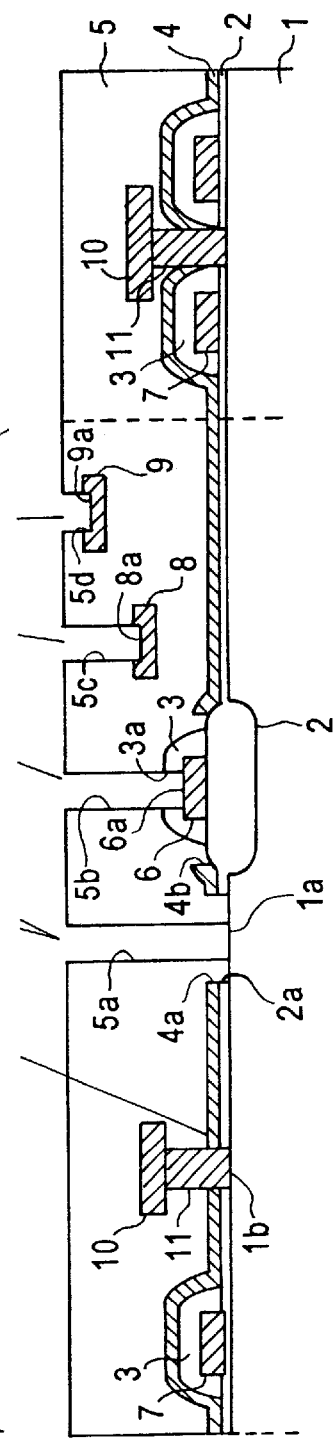
FIG. 1(a)
FIG. 1(b)

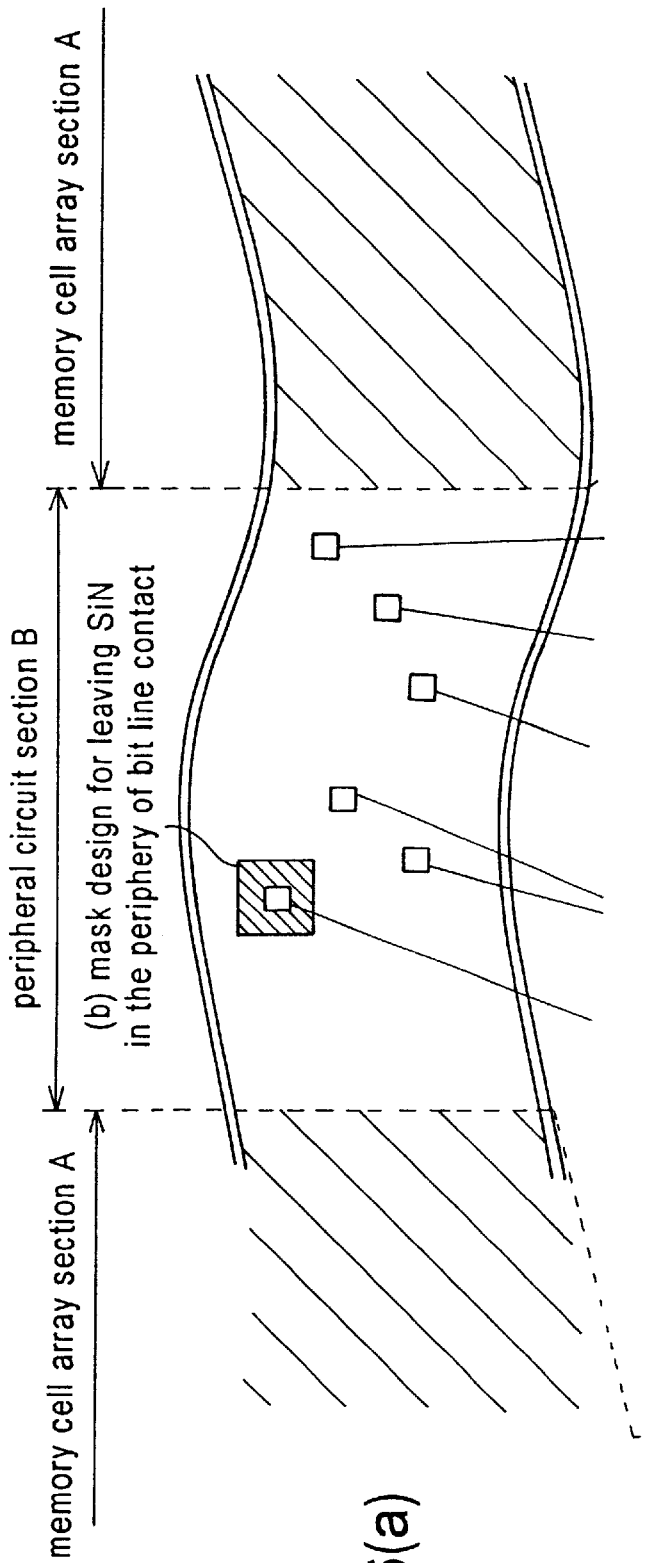
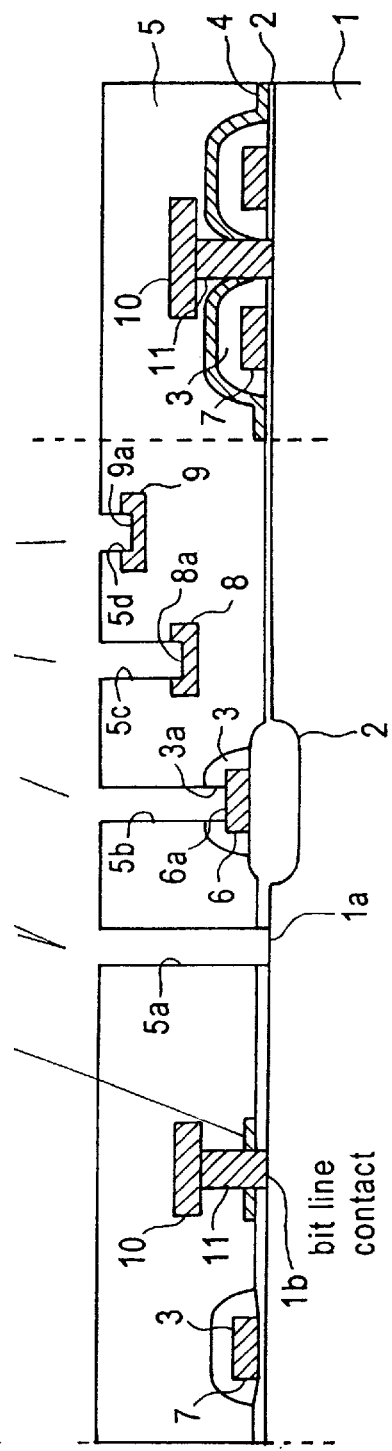
FIG. 6(a)
FIG. 6(b)

TG structure of peripheral circuit section with aluminum contact

TG structure of memory cell array section without aluminum contact (Background)

(Background)

SiN side wall method
(SiN film)

(Background)

blanket SiN method
(SiN film)

(Background)

(Background)

SEMICONDUCTOR DEVICE AND MANUFACTURING PROCESS THEREOF

This application is a Continuation of application Ser. No. 09/283,752 filed Apr. 2, 1999, now U.S. Pat. No. 6,268,278 which is a Divisional of application Ser. No. 08/687,624 filed on Jul. 26, 1996 and now U.S. Pat. No. 6,087,710.

TECHNICAL FIELD

The present invention relates to a semiconductor device using a self-alignment contact and a manufacturing process thereof, and more particularly to an aluminum contact after a self-alignment contact process of a semiconductor device.

BACKGROUND ART

A conventional semiconductor device using self-alignment contact process is first described taking up a dynamic random access memory (DRAM) as an example. FIG. 29 shows a plan view and a cross-sectional view of a conventional DRAM structure. As shown in FIG. 29, in a memory cell of the DRAM, first transfer gates (word lines: WL) are disposed on a semiconductor substrate, and is then bit lines (BL) are further placed thereabove. Therefore, a bit line contact is designed between word lines, and dropped into a gap between word lines from above.

On the other hand, with regard to the capacitor, a three-dimensional stack type cell or a trench type cell has been developed instead of the conventional parallel flat plate type electrode that has reached a limit of capacity. In particular, in the stack type, the COB structure (Capacitor-Over-Bit line) is capable of occupying the full area of an unit cell as a memory region, regardless of the bit line contact. Therefore the COB structure has been evaluated again and is being employed increasingly (see for example, IDEM Tech. Dig. 1988, pp. 592–595). In this structure, as suggested by the name COB, the capacitor is located over the bit line. Therefore a contact of the capacitor, i.e., a storage node contact is to be designed inside the lattices formed by the bit lines and word lines, and the contact has to be dropped into a gap between the lattices from above.

With the progress of ultra-fine processing technology, it has become increasingly difficult to control the total variation in overlay or dimension to be smaller than the advancing speed of micronization. If there is any deviation in overlay, the bit line contact or storage node contact may short-circuit with the transfer gate, as shown in FIG. 29, for example. It is therefore required to establish a process assembling technology, or a self-alignment contact technology having a certain margin of controllability in lateral direction in the ultra fine manufacturing process.

FIG. 30 shows an example of self-alignment contact technology using a silicon nitride film. In the technology, there are SiN (silicon nitride) film side wall method and a blanket SiN (silicon nitride) film method. In the SiN (silicon nitride) film side wall method (see U.S. Pat. No. 5,270,240, for example), an upper and side surface of a lead line are covered with a nitride film. In the blanket SiN film method (see Symp. VLSI Tech. Dig. 1987, pp. 93–94, for example), a nitride film is held between interlayer oxide films. In both methods, it is intended to cover a bottom line serving as a transfer gate with a SiN film which functions as an etching stopper. In the SiN side wall method, an oxide film is etched to make a contact with a substrate without cutting through the SiN film. On the other hand, in the blanket SiN method, etching of an oxide film is once stopped at a SiN, and then the SiN and underlying oxide film are etched to make a contact with the substrate.

In such a device having an opening in an oxide layer for self-alignment contact with a nitride film as a stopper, there arises a problem of contact etching for aluminum leads in the later process. FIG. 31 shows various states of aluminum contacts provided through an interlayer insulating film, and indicates that contacts are to be made at various depths in the interlayer film. As shown in FIG. 31, particularly when an interlayer film for the aluminum contact is flattened, the contact becomes deeper in the active region or on the word line, and aspect ratio becomes large. In the fine contact hole with a large aspect ratio, a RIE Lag (reactive ion etching lag) takes place thereby increasing etching speed in the bottom of the hole. Particularly in the self-alignment method employing a nitride film as a stopper, a hard-to-etch nitride film is located on the bottom of the deep contact hole where RIE lag is likely to occur. Therefore, over etching or penetrating may occur in bit line hole or cell plate hole on the upper part, while an opening in the nitride film is being provided in the other deep hole.

Thus, in the conventional manufacturing process of a semiconductor device using self-alignment contacts, various problems exist in the later process of forming an aluminum contact.

DISCLOSURE OF THE INVENTION

The present invention was made to solve the problems discussed above, and has an advantage of providing a semiconductor device and a manufacturing process thereof in which a self-alignment contact technology is introduced using a silicon nitride film or the like, and a conductive path such as an aluminum contact is effectively formed between layers.

According to one aspect of the present invention, a semiconductor device includes a semiconductor substrate which has a plurality of contact portions on a principal plane. An insulating film is applied to the principal plane of the semiconductor substrate. A conductive section having a contact portion is disposed in the insulating film near the principal plane of the semiconductor substrate. A silicon nitride film is disposed in the insulating film for covering the principal plane of the semiconductor substrate and the conductive section. A conductive path is provided through the insulating film and the silicon nitride film and extended to the contact portion of the conductive section.

In another aspect of the present invention, the semiconductor device further comprises a conductive path provided through the insulating film and the silicon nitride film, and extended to one of the contact portions of the semiconductor substrate.

In another aspect of the present invention, the semiconductor device further comprises a conductor having a contact portion disposed in the insulating film. Another conductive path is provided through the insulating film and extended to the contact portion of the conductor.

The inventions stated above are preferably applied to a semiconductor memory device, in which the conductive section serves as a transfer gate, and the conductor in the insulating film serves as a bit line or a cell plate.

In another aspect of the present invention, a semiconductor device includes a semiconductor substrate which has a plurality of contact portions on a principal plane. An insulating film is applied to the principal plane of the semiconductor substrate. A conductive section having a contact portion is disposed in the insulating film near the principal plane of the semiconductor substrate. A conductive section having a contact portion is disposed in the insulating film near the principal plane of the semiconductor substrate. A silicon nitride film is disposed in the insulating film over and at a surrounding area of at least one of the contact portions on the principal plane of the semiconductor substrate and the silicon nitride film is removed in the region of the other contact portions and the conductive section. A conductor is disposed in the insulating film, and a conductive path is provided through the insulating film and the silicon nitride film, and is extended from the conductor to one of the contact portions of the semiconductor substrate. Another conductive path is provided through the insulating film and extended to the contact portion of the conductive section.

In another aspect of the present invention, the semiconductor device further comprises a conductive path provided through the insulating film and extended to the other contact portion of the semiconductor substrate.

In another aspect of the present invention, the semiconductor device further comprises another conductor having a contact portion thereof disposed in the insulating film. Another conductive path is provided through the insulating film and extended to the contact portion of another conductor.

The inventions stated above are preferably applied in a semiconductor memory device, in which the conductive section serves as a transfer gate, and the conductor in the insulating film serves as a bit line, and another conductor in the insulating film serves as a bit line or a cell plate.

In another aspect of the present invention, a semiconductor device include a semiconductor substrate which has a plurality of contact portions on a principal plane. An insulating film is applied to the principal plane of the semiconductor substrate. A conductive section having a contact portion is disposed in the insulating film near the principal plane of the semiconductor substrate is projected from the principal plane. A silicon nitride film is disposed on a side surface of the conductive section in the insulating film. A conductive path is provided through the insulating film and extended to at least one of the contact portions of the semiconductor substrate.

In another aspect of the present invention, the semiconductor device further comprises a conductive path provided through the insulating film and extended to at least one of the contact portions of the semiconductor substrate.

In another aspect of the present invention, the semiconductor device further comprises a conductor having a contact portion thereof disposed in the insulating film, and another conductive path is provided through the insulating film and extended to the contact portion of the conductor.

In inventions stated above are preferably applied in a semiconductor memory device, in which the conductive section serves as a transfer gate, and the conductor in the insulating film serves as a bit line or a cell plate.

In another aspect of the present invention, a semiconductor device includes a semiconductor substrate which has a plurality of contact portions on a principal plane. An insulating film is applied to the principal plane of the semiconductor substrate. A conductive section having a contact portion is disposed in the insulating film near the principal plane of the semiconductor substrate and is projected from the principal plane. A silicon nitride film is disposed to cover a surface of the conductive section in the insulating film. A conductive path is provided through the insulating film and the silicon nitride film and extended to the contact portion of the conductive section.

In another aspect of the present invention, the semiconductor device further comprises a conductive path provided through the insulating film and extending to at least one of the contact portions of the semiconductor substrate.

In another aspect of the present invention, the semiconductor device further comprises a conductor having a contact portion disposed in the insulating film, and another conductive path is provided through the insulating film and extended to the contact portion of another conductor.

The inventions stated above are preferably applied in a semiconductor memory device, in which the conductive section serves as a transfer gate, and the conductor in the insulating film serves as a bit line or a cell plate.

According to another aspect of the present invention, in a manufacturing process of a semiconductor device, a first insulating film is applied to a principal plane of a semiconductor substrate. A conductive section is formed on the first insulating film. A second insulating film is applied to the conductive section. A silicon nitride film is applied to the first and second insulating films. The silicon nitride film is removed at least from a region of the contact portion of the conductive section. A third insulating film is applied to the whole surface. A conductive path is formed through the third insulating film and is extended to the contact portion of the conductive section.

In another aspect of the present invention, in a manufacturing process of a semiconductor device, a first insulating film is applied to a principal plane of a semiconductor substrate. A conductive section having a contact portion thereof is formed on the first insulating film. A second insulating film is applied to the conductive section. A silicon nitride film is applied to the first and second insulating films. The silicon nitride film is removed leaving at a predetermined portion of the principal plane of the semiconductor substrate. The whole surface is covered with a third insulating film, and a conductive path is formed through the third insulating film and extended to the contact portion of the conductive section.

In another aspect of the present invention, in a manufacturing process of a semiconductor device, a first insulating film is applied to a principal plane of a semiconductor substrate. A conductive section having a contact portion thereof is formed on the first insulating film. The conductive section is covered with a second insulating film. A silicon nitride film is applied to the first and second insulating films. The silicon nitride film is removed leaving at a side surface of the conductive section. The whole surface is covered with a third insulating film, and a conductive path is formed through the third insulating film and extended to the contact portion of the conductive section.

In another aspect of the present invention, in a manufacturing process of a semiconductor device, a first insulating film is applied to a principal plane of a semiconductor substrate. A conductive section having a contact portion thereof is formed on the first insulating film. A second insulating film is applied to the conductive section. A silicon nitride film is applied to the first and second insulating films. A third insulating film is applied to the silicon nitride film. A conductive path is formed through the third insulating film, the silicon nitride film and the second insulating film and extended to the contact portion of the conductive section.

In another aspect of the present invention, in a manufacturing process of a semiconductor device, further a conductor having a contact portion is embedded in the third insulating film, and a conductive path is formed through the third insulating film and extended to the contact portion of the conductor.

In another aspect of the present invention, in a manufacturing process of a semiconductor device, further a conductor having a contact portion to which another silicon nitride film is applied is embedded in the third insulating film, and a conductive path is formed through the third insulating film and another silicon nitride film and is extended to the contact portion of the conductor.

In another aspect of the present invention, in a manufacturing process of a semiconductor device, an insulating film is applied to a principal plane of a semiconductor substrate having a plurality of contact portions. A conductive section having a contact portion is formed on the insulating film. The conductive section is covered with a silicon nitride film. The silicon nitride film and the insulating film is covered with another insulating film. A conductive path is formed through the insulating film and the silicon nitride film and extended to the contact portion of the conductive section.

Further, in another aspect of the present invention, in a manufacturing process of a semiconductor device, a conductive path is formed through the insulating film and another insulating film, and is extended to the contact portion of the semiconductor substrate.

Other features and advantages of the invention will be apparent from the following description.

BRIEF DESCRIPTION OF DRAWINGS

FIG. 1(*a*) is a plan view and FIG. 1(*b*) is a cross sectional view for explaining a structure of a semiconductor device in accordance with the first embodiment of the present invention;

FIG. 6(*a*) is a plan view and FIG. 6(*b*) is a cross sectional view for explaining a structure of a semiconductor device in accordance with the third embodiment of the invention;

BEST MODE FOR CARRYING OUT THE INVENTION

First Embodiment

Figure 2:
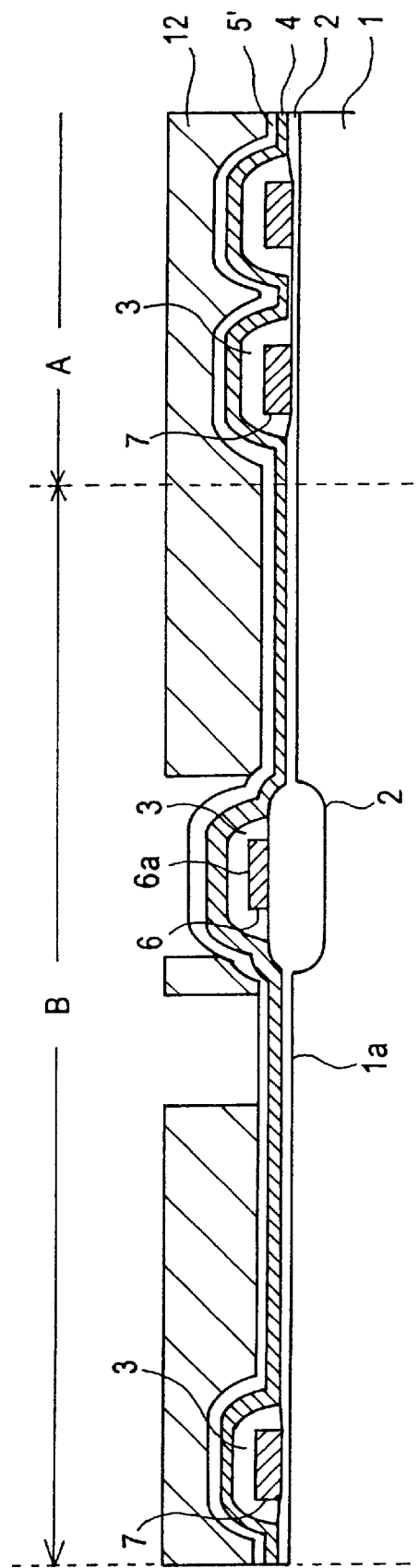
FIG. 2 through FIG. 5 are views for explaining a manufacturing method of a semiconductor device in accordance with the second embodiment of the invention.

FIGS. 1(*a*) and 1(*b*) illustrate a structure of a semiconductor device according to the first embodiment of the present invention, and which FIG. 1(*a*) shows a plan view of the structure, and FIG. 1(*b*) shows a sectional view of the structure. In the explanation of this embodiment, a DRAM is described as an example of the semiconductor device. The illustrated semiconductor device (DRAM) is comprised of a memory cell array section A without aluminum contact, and peripheral circuit section B having a substrate, a transfer gate, bit lines, and an aluminum contact with a cell plate.

As shown in the drawings, the semiconductor device comprises a semiconductor substrate 1, an oxide film 2 serving as a first insulating film, and oxide film 3 serving as a second insulating film, a silicon nitride film 4, an interlayer insulating film or interlayer oxide film 5 serving as a third insulating film, conductive sections 6 and 7 on the first oxide film 2, conductive sections 8 and 9 in the interlayer insulating film 5, another conductive section 10 in the interlayer insulating film 5, and its contact passage 11.

The semiconductor substrate 1 has a number of elements formed on a principal plan thereof. On the semiconductor substrate 1, a contact portion 1*a* for contacting between layers and a contact portion 1*b* for contacting the conductive section 10 are shown. The first oxide film 2 is applied to the principal plane of the semiconductor substrate 1 to form a gate oxide film, and an opening 2*a* is provided in the contact portion 1*a* of the semiconductor substrate 1. The second oxide film is applied to the conductive sections 6 and 7, and is formed to cover them. The second oxide film 3 covering the conductive section 6 has an opening 3*a* provided in the contact portion 6*a* of the conductive section 6.

The silicon nitride film (SiN) 4 is applied to the first oxide film 2 and second oxide film 3, and an opening 4*a* is provided in the contact portion 1*a* of the principal plane of the semiconductor substrate 1, and an opening 4*b* is provided in the contact portion 6*a* of the conductive section 6. The silicon nitride film 4 is formed for the purpose of self-alignment contact in the memory cell array section A, and is formed simultaneously also in the peripheral section B.

The interlayer insulating film 5 is applied to a region around the contact portion 1*a* of the principal plane of the semiconductor substrate 1, to the first oxide film 2 and second oxide film 3 around the contact portion 6*a* of the conductive section 6, and to the silicon nitride film 4, and the interlayer insulating film 5 has an opening 5*a* provided in the contact portion 1*a* of the semiconductor substrate 1 and another opening 5*b* provided in the contact portion 6*a* of the conductive section 6. The interlayer insulating film 5 has a further opening 5*c* provided in a contact portion 8*a* of the conductive section 8 disposed at a middle position in the interlayer insulating film 5, and a further opening 5*d* provided in a contact portion 9*a* of the conductive section 9.

The conductive section 6 is disposed so as to project from the first oxide film 2, and is a conductive part to be a word line serving as a transfer gate. The conductive section 7 is disposed so as to project from the electrode or word line. The conductive section 8 is a conductive part serving as a bit line disposed at a middle position in the interlayer insulating film 5, and has a contact portion 8a. The conductive section 9 is a conductive part serving as a cell pate of a capacitor disposed at a middle position in the interlayer insulating film 5, and it has a contact portion 9a. The conductive section 10 is a conductive part serving as bit line disposed at a middle position in the interlayer insulating film 5 in the same manner as the conductive section 8, and has contact passage 11.

In the memory cell array section A of this semiconductor device, there are bit line contact passage 11 and storage node contact (not shown) serving as conductive paths to the semiconductor substrate 1, and a self-alignment technology is utilized herein.

On the other hand, in the peripheral circuit section B, there is a bit line contact passage 11 which is formed simultaneously with the bit line contact passage 11 of the memory cell array section A. Further, there are upper metal leads, so-called aluminum contacts, in the openings 5a, 5b, 5c, 5d of the interlayer insulating film 5, formed to serve as interlayer conductive paths, extending to the contact portion 1a of the semiconductor substrate 1, contact portion 6a of the conductive section 6, contact portion 8a of the conductive section 8 in the middle position, and contact portion 9a of the conductive section 9 in the middle position, respectively.

As described above, in the semiconductor device according to this first embodiment, the silicon nitride film is removed from the surrounding area of the contact portions to which contact with the upper metal lead (aluminum contact) is made. As a result, there is no nitride film used for self-alignment at all portions of aluminum contacts, and etching is not caused to stop on the nitride film.

This first embodiment may be also understood as follows. That is, in the semiconductor device according to the first embodiment, an insulating film including the insulating films 2, 3, and 5 is applied to the principal plane of the semiconductor substrate 1, and in this semiconductor film, the conductive section 6 is disposed near the principal plane of the semiconductor substrate 1. Further, the silicon nitride film 4 is disposed in this insulating film so as to cover the principal plane of the semiconductor substrate 1 and the conductive section 6. Furthermore, a conductive path is provided through the insulating film and silicon nitride film 4 extending to the contact portion 6a of the conductive section 6. Similarly, a conductive path is provided through the insulating film and silicon nitride film 4 extending to the contact portion 1a of the semiconductor substrate 1. The opening diameter of the silicon nitride film 4 is formed to be larger than those of the conductive paths. In the insulating film, other conductive sections 8 and 9 are disposed, and conductive paths are provided through the insulating film extending to the contact portions 8a and 9a of those conductive sections.

Second Embodiment

FIGS. 2 to 5 are to explain a manufacturing process of a semiconductor device according to the second embodiment of the invention, and this manufacturing process is suitable for manufacturing the semiconductor device of the structure as described in the first embodiment. In the drawings, the same reference numerals as in FIG. 1 designate same or like parts.

Now the manufacturing process will be described. First, as shown in FIG. 2, a first insulating film (oxide film) 2 is applied to the principal plane of the semiconductor substrate 1. On a part of this first oxide film 2, a conductive section (transfer gate) 6 and a conductive section (word line) 7 are formed so as to project therefrom. These conductive sections 6 and 7 are further covered with a second insulating film (oxide film) 3.

Further, a silicon nitride film 4 is applied to the entire surface. This silicon nitride film 4 is formed for self-alignment contact in the memory cell array section A, and is simultaneously formed also in the peripheral section B. Furthermore, a fourth insulating film (silicon oxide film) 5' is applied to the entire surface. Thereafter, a resist 12 is applied to the entire surface, and openings are provided in a region around the contact portion 1a of the semiconductor substrate 1 and in a region around the contact portion 6a of the conductive section 6.

Figure 3:
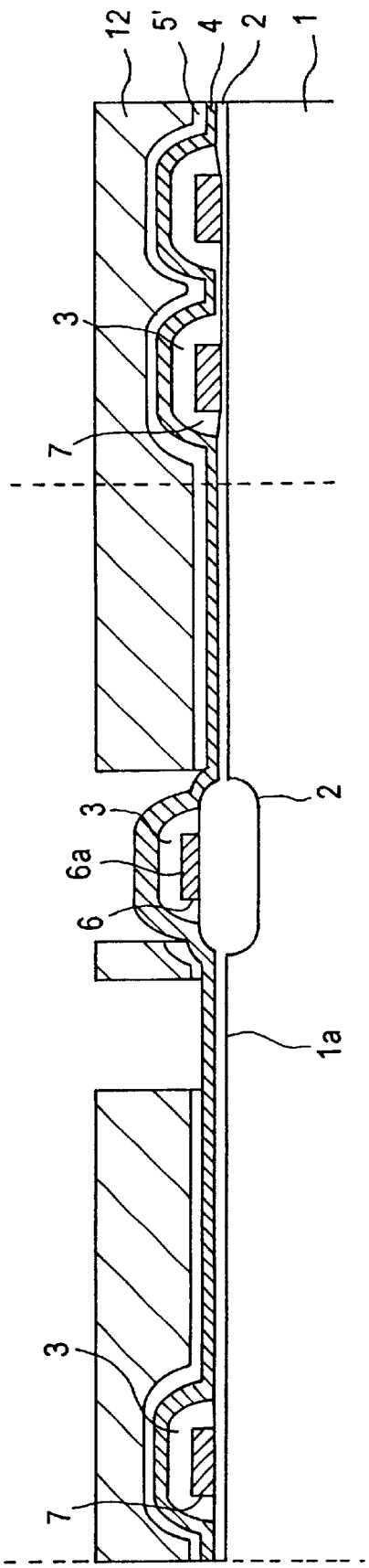
Figure 4:
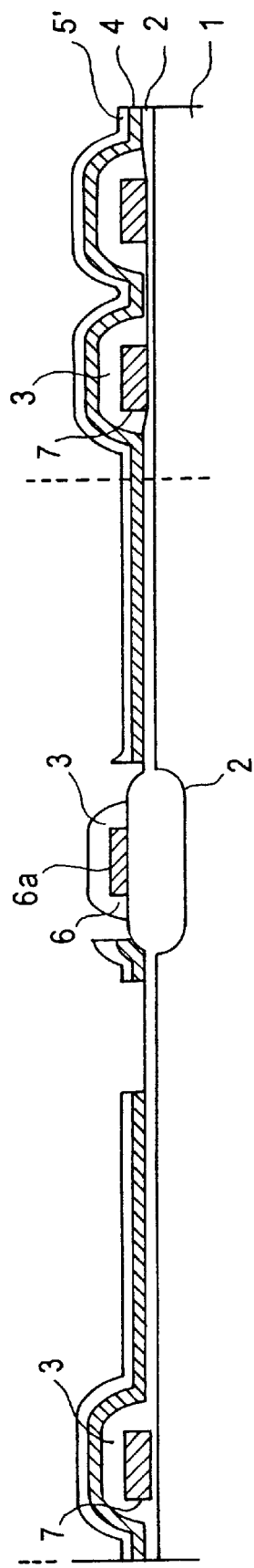

Then, as shown in FIG. 3, the fourth oxide film 5' is selectively removed from this opening by etching. Further, as shown in FIG. 4, the resist 12 is removed. And employing the remaining fourth oxide film 5' as a mask, a wet etching is performed with the use of hot phosphoric acid or the like, whereby the silicon nitride film 4 is selectively removed.

Figure 5:
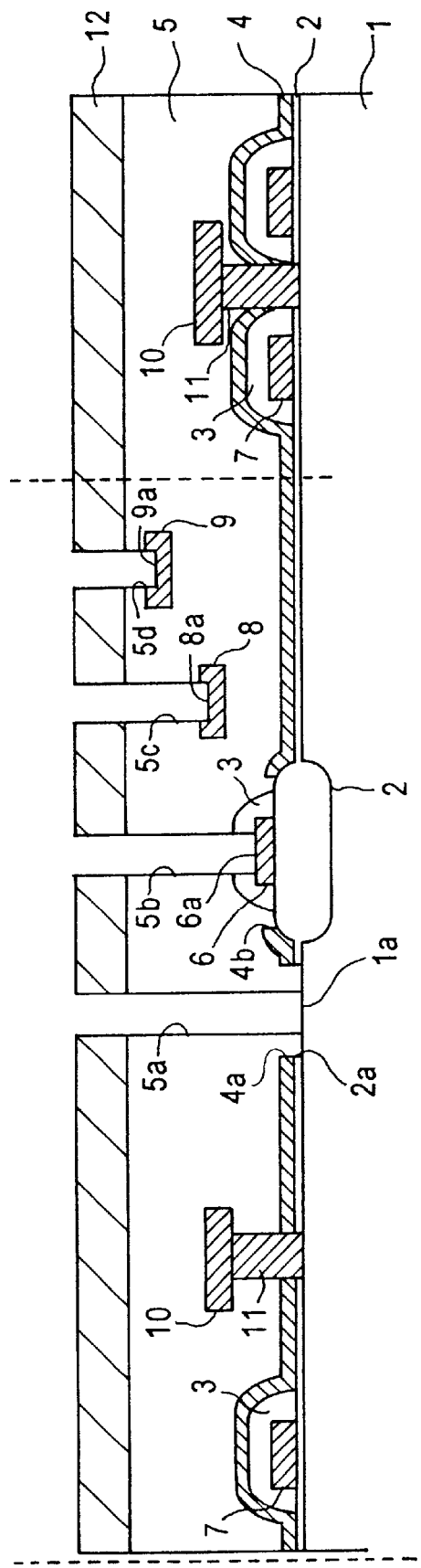

Then, as shown in FIG. 5, the silicon oxide film 5 serving as the interlayer insulation layer is applied and is flattened on the entire surface including the upper parts of the first and second oxide films 2 and 3 on the semiconductor substrate 1. The remaining fourth oxide film 5' is integrated with the interlayer oxide film 5 and, therefore, is not shown separately in the drawing. In this process, an opening is provided through the silicon nitride film 4 on the bit line contact portion 1b in the principal plane of the semiconductor substrate 1 and the first oxide film 2, and a bit line contact passage 11 is formed therein. Further, the conductive section (bit line) 8 and conductive section (bit line) 10 are disposed at the middle position of the interlayer oxide film 5. Furthermore, a conductive section (cell plate) 9 is likewise formed, and is buried in the interlayer oxide film 5.

Thereafter, by applying a resist 13 and by making openings at locations for aluminum contacts from above, the interlayer oxide film 5 is selectively etched, whereby openings are provided to prepare conductive paths to the contact portion 1a of the semiconductor substrate 1, contact portion 6a of the conductive section 9. Then, the resist 13 is removed, and utilizing the mentioned openings of the interlayer oxide film 5, the aluminum contacts are accomplished to serve as conductive paths to the circuit on the upper side of the interlayer insulating film 5.

Thus, in the first embodiment, the oxide film 5' is overlaid on the nitride film 4, and the oxide film 5' is patterned by the resist 12. And after removing the resist 12, the wet etching is performed with the use of hot phosphoric acid or the like employing the oxide film 5' as a mask.

As described above, according to the manufacturing method of the semiconductor device in this embodiment, the surrounding silicon nitride film is removed from the contact portions to be put in contact with the metal lead (aluminum contact). As a result, the nitride film used in self-alignment is removed from all aluminum contact area, and the problem of etching stop on the nitride film is overcome. In the conventional method of cutting off the nitride film by dry etching using the resist as a mask, there has been a possibility that the selection ratio with respect to the oxide film is not enough, whereby the substrate 1 might be cut off. On the other hand, in this embodiment, by using a wet etching of which selection ratio with respect to the oxide film is large enough, a stable manufacturing process free from erroneous cutting of substrate or free from plasma damage is achieved.

This embodiment my be also stated as follows. That is, in the manufacturing process according to this embodiment, the first insulating film 2 is applied on the principal plane of the semiconductor substrate 1. The conductive section 6 is formed on the first insulating film 2, and then the conductive section 6 is covered with the second insulating film 3. The first insulating film 2 and second insulating film 3 are covered with the silicon nitride film 4. The silicon nitride film 4 is removed at least in the region of the contact portion 6a of the conductive section and the removed part is covered with the third insulating film 5. A plurality of openings are provided in the third insulating film 5, and conductive paths are provided through the third insulating film 5 extending to the contact portion 6a of the conductive section 6.

Third Embodiment

FIGS. 6(a) and (b) illustrate the structure of a semiconductor device according to the third embodiment of the invention, and in which FIG. 6(a) is a plan view, and FIG. 6(b) is a sectional view of the structure. The illustrated semiconductor device (DRAM) is comprised of a memory cell array section A without aluminum contact, and a peripheral circuit section B having a substrate, transfer gate, bit line, and aluminum contact on cell plate. In the drawings, same reference numerals as in FIG. 1 designate same or equivalent parts respectively.

As shown in the drawings, the semiconductor device comprises a semiconductor substrate 1, a first oxide film 2, a second oxide film 3, a silicon nitride film 4, an interlayer insulating film 5, a conductive section 6 and a conductive section 7 formed on the first oxide film 2, a second oxide film 3, a silicon nitride film 4, an interlayer insulating film 5, a conductive section 6 and a conductive section 7 formed on the first oxide film 2, a conductive section 8 and a conductive section 9 disposed at the middle position in the interlayer insulating film 5, a further conductive section 10 disposed at the middle position in the interlayer insulating film 5, and a contact a passage 11 thereof.

The semiconductor substrate 1 may have a number of elements formed on a principal plane thereof. A contact portion 1a for contacting the conductive section 10 are shown herein. The first oxide film 2 is applied to the principal plane of the semiconductor substrate 1 to be a gate oxide film, and an opening 2a is provided in the contact portion 1a of the semiconductor substrate 1.

The second oxide film 3 is applied to cover the conductive sections 6 and 7 disposed on the first oxide film 2. The second oxide film 3 covering the conductive section 6 has an opening 3a provided in the contact portion 6a of the conductive section 6.

The silicon nitride film (SiN) 4 is applied to the first oxide film 2 and second oxide film 3 in the memory cell array section A. In the peripheral circuit section B having aluminum contact, the silicon nitride film (SiN) 4 is applied to the oxide film 2 only in the region surrounding the line contact portion 1b and around the bit line contact passage 11. This silicon nitride film 4 is formed for the purpose of self-alignment contact in the memory cell array section A, and is simultaneously formed also in the peripheral section B.

The interlayer insulating film 5 is applied to the first oxide film 2, second oxide film 3 and silicon nitride film 4, and has an opening 5a provided in the contact portion 1a of the semiconductor substrate 1 and another opening 5b provided in the contact portion 6a of the conductive section 6. Further, an opening 5c is provided in a contact portion 8a of the conductive section 8 at the middle position buried in the interlayer insulating film 5, and an opening 5d is provided in a contact portion 9a of the conductive section 9 in the middle position.

The conductive section 6 is a conductive part to be a word line serving as a transfer gate. The conductive section 7 is a conductive part to be a gate electrode or word line. The conductive section 8 is a conductive part serving as a bit line disposed at a middle position buried in the interlayer insulating film 5 and has a contact portion 8a. The conductive section 9 is a conductive part serving as a cell plate of capacitor buried in the interlayer insulating film 5 and has a contact portion 9a. The conductive section 10 is a conductive part serving as a bit line in the same manner as the conductive section 6 at the middle position buried in the interlayer insulating film 5 and has a contact passage 11 to the semiconductor substrate 1.

In the memory cell array section A of this semiconductor device, there is a bit line contact passage 11 and storage node contact (not shown) serving as conductive paths to the semiconductor substrate 1, and herein a self-alignment technology is utilized.

On the other hand, in the peripheral circuit section B, there is shown a bit line contact passage 11 which is formed simultaneously with the bit line contact passage 11 of the memory cell array section A. Further, there are upper metal leads, so-called aluminum contacts, in the opening 5a, 5b, 5c, 5d of the interlayer insulating film 5, formed to serve as interlayer conductive paths, extending to the contact portion 1a of the semiconductor substrate 1, contact portion 6a of the conductive section 6, contact portion 8a of the conductive section 8 in the middle position, and contact portion 9a of the conductive section 9 in the middle position, respectively.

There are also bit line 10 and a contact passage 11 thereof formed simultaneously with the bit line 10 and its contact portion 11 in the memory cell array section A.

In the semiconductor device according to this embodiment, the nitride film 4 is left only around the bit line contact 1b is left because the silicon nitride film is necessary in the self-alignment technology in the same way as in the bit line contact of the memory cell array section.

As a result of adopting the above construction, the nitride film 4 employed in the self-alignment technique is removed from all aluminum contact area in the peripheral circuit section B, so that the problem of etching stop on the nitride film 4 is overcome. In this embodiment, furthermore, the area where the silicon nitride film is left in the peripheral circuit section is minimized except in the memory cell array section. As a result of minimizing the silicon nitride film of high dielectric constant disposed among the leads in the peripheral circuit section, there is an advantage such that the capacity among the leads may be reduced, and the electric characteristics, particularly operating speed, may be improved.

This embodiment may be also restated as follows. That is, in the semiconductor device of the embodiment, an insulating film including the insulating films 2, 3, 5 is applied to the semiconductor substrate 1 having contact portions 1a and 1b on its principal plane, and in this insulating film and is left so as to cover the surrounding area of the contact portion 1b of the principal plane of the semiconductor substrate 1, and is removed in the region of the contact portion 1a and conductive section 6. Furthermore, another conductive section 10 is disposed in the insulating film, and a contact passage 11 is formed extending from this conductive section 10 to the contact portion 1b of the semiconductor substrate 1 through the insulating film and silicon nitride film 4. In addition, a conductive path extending to the contact portion 1a of the semiconductor substrate 1 are formed through the insulating film. Moreover, conductive paths extending to the contact portions 8a and 9a of the conductive sections 8 and 9 in the insulating film are respectively provided through the insulating film.

Fourth Embodiment

FIGS. 7 to 10 illustrate the manufacturing method of a semiconductor device according to the fourth embodiment of the invention, and this manufacturing process is suitable for manufacturing the semiconductor device of the structure as described in the third embodiment. In the drawings, same reference numerals as in FIG. 1 or FIG. 2 designate same or like parts.

Figure 7:
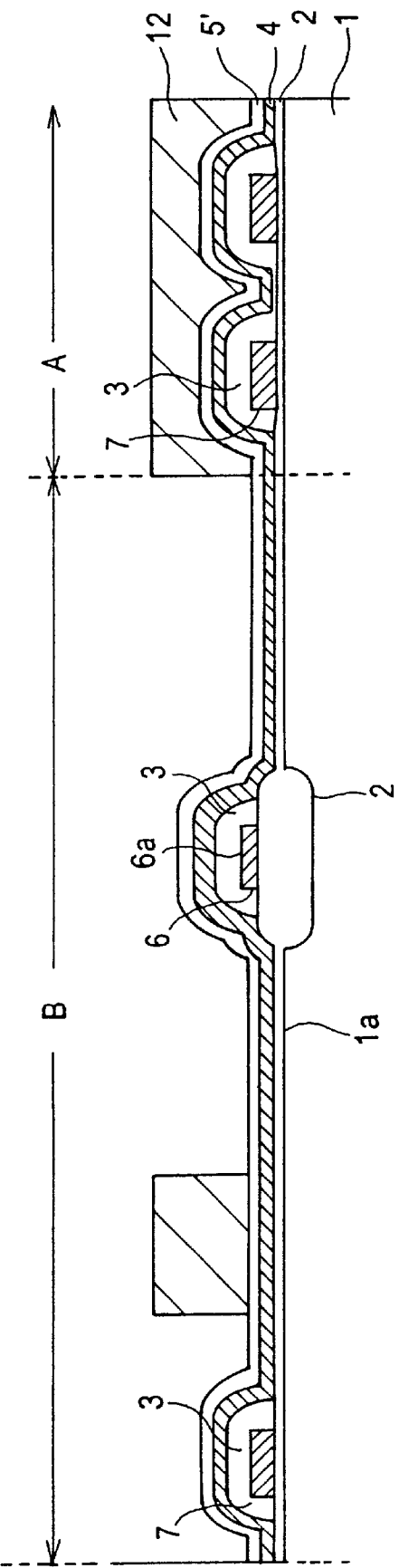
FIG. 7 through FIG. 10 are views for explaining a manufacturing method of a semiconductor device in accordance with the fourth embodiment of the invention.
Figure 8:
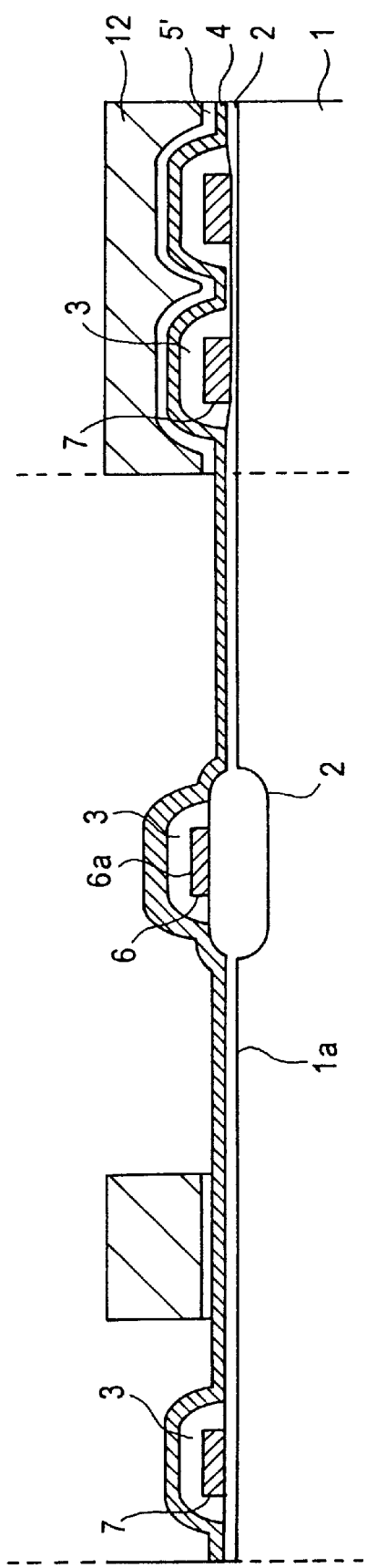

Now the manufacturing process is described. As shown in FIG. 7, a first insulating film (oxide film) 2 is applied to the principal plane of the semiconductor substrate 1. On a part of this first oxide film 2, a conductive section (transfer gate) 6 and a conductive section (word line) 7 are formed. These conductive sections 6 and 7 are further covered with a second insulating film (oxide film) 3. Further, a silicon nitride film 4 is applied to the entire surface. This silicon nitride film 4 is applied to the entire surface. This silicon nitride film 4 is formed for self-alignment contact in the memory cell array section A, and is simultaneously formed also in the peripheral section B. Further, a fourth insulating film (silicon oxide film) 5' is applied to the entire surface. In the peripheral circuit section B having aluminum contacts, the resist 12 is removed while being left only in the region around the contact portion 1b of the principal plane of the semiconductor substrate 1 which is to come in contact with the bit line. Then, as shown in FIG. 8, the fourth oxide film 5' is selectively removed by etching from the region where the resist 12 is removed.

Figure 9:
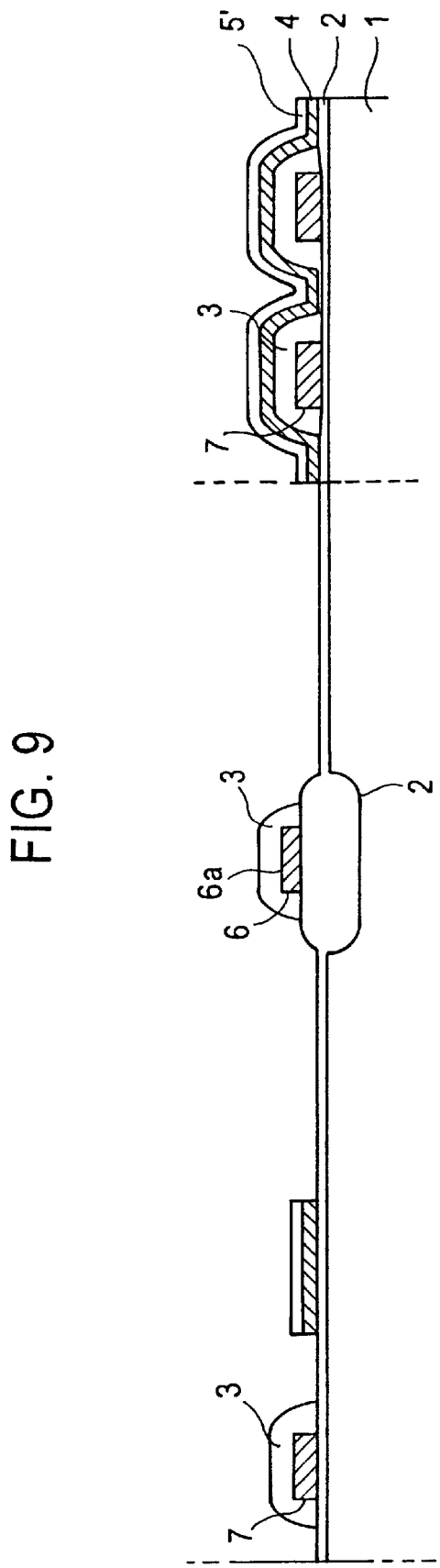

Then, as shown in FIG. 9, the remaining resist 12 is removed, and utilizing the selectively etched fourth oxide film 5' as a mask, a wet etching is performed by hot phosphoric acid or the like, and the silicon nitride film 4 is left only around the bit line contact 1b. In the remaining regions, the silicon nitride film 4 is selectively removed by etching.

Figure 10:
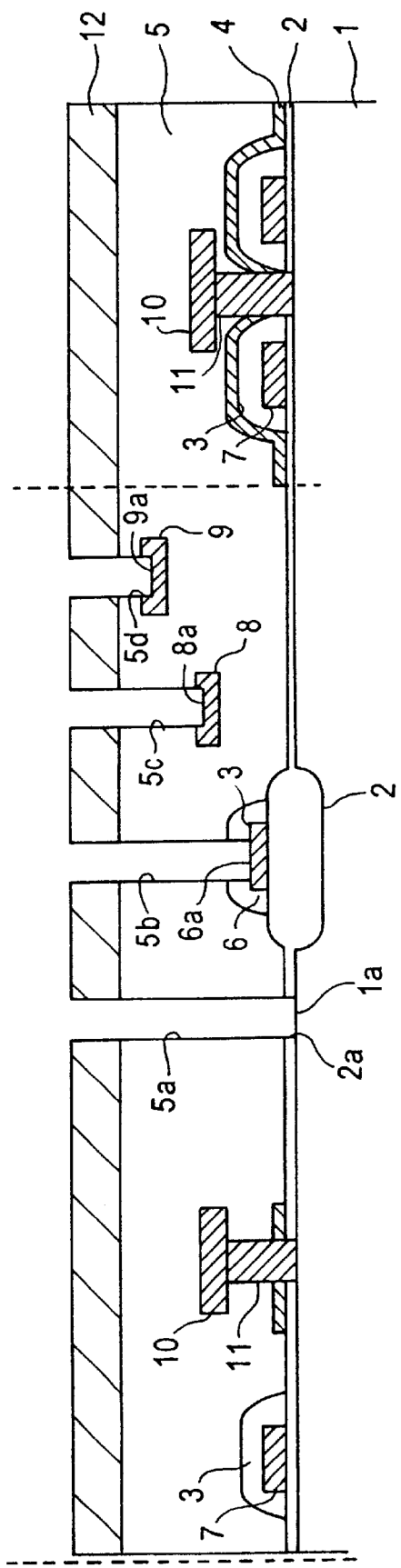

Then, as shown in FIG. 10, the silicon oxide film 5 serving as the interlayer insulation layer is applied and flattened on the entire surface including the first and second oxide films 2 and 3 and the silicon nitride film 4 on the semiconductor substrate 1. The remaining fourth on the semiconductor substrate 1. The remaining fourth oxide film 5' is integrated with the interlayer oxide film 5 and, therefore, is not shown separately in the drawing. In this process, an opening is provided through the silicon nitride film 4 and the first oxide film 2 on the bit line contact portion 1b in the principal plane of the semiconductor substrate 1, and a bit line contact passage 11 is disposed therein. Further, the conductive section (bit line) 8 and conductive section (bit line) 10 are disposed in the middle position of the interlayer oxide film 5. Furthermore, a conductive section (cell plate) 9 is likewise formed, and buried into the interlayer oxide film 5.

Thereafter, by applying a resist 13 to the entire surface and by making opening at locations where an aluminum contact is to be made from above, the interlayer oxide film 5 is selectively etched, whereby opening are provided for conductive paths to the contact portion 1a of the semiconductor substrate 1, contact portion 6a of the conductive section 6, contact portion 8a of the conductive section 8, and contact portion 9a of the conductive section 9. Then, the resist 13 is removed, and utilizing the openings of the interlayer oxide film 5, the aluminum contacts are accomplished to serve as conductive paths to the upper part.

Thus, in this embodiment, the oxide film 5' is overlaid on the nitride film 4, and the oxide film 5' is patterned by the resist 12, and after removing the resist 12, the wet etching is performed with the use of hot phosphoric acid or the like employing the oxide film 5' as a mask.

As described above, in the manufacturing process of the semiconductor device according to this embodiment, the nitride film 4 used in self-alignment is removed from all area for aluminum contacts in the peripheral circuit section B, and the problem of etching stop on the nitride film 4 is overcome. Further, in this embodiment, area of the silicon nitride 4 left in the peripheral circuit section B is minimized other than the memory cell array section A. Therefore, as a result of minimizing the silicon nitride film of high dielectric constant disposed among the leads in the peripheral circuit section B, the capacity among the leads may be reduced, and the electric characteristics, particularly operating speed, may be improved.

In the conventional method of cutting off the nitride film by dry etching using the resist as a mask, there has been a possibility that the selection ratio with respect to the oxide film is not enough, whereby the substrate 1 might be cut off. On the other hand, in this embodiment, by using a wet etching of which selection ratio with respect to the oxide film is large enough, a stable manufacturing process is achieved free from erroneous cutting of substrate or free from plasma damage.

This embodiment may be also stated as follows. That is, in the manufacturing process according to this embodiment, the first insulating film 2 is applied on the principal plane of the semiconductor substrate 1, and the conductive section 6 is formed on this first insulating film 2. The conductive section 6 is covered with the second insulating film 3, and then the first insulating film 2 and second insulating film 3 are covered with the silicon nitride film 4. Next, the silicon nitride film 4 is removed while leaving it only at a part of the principal plane, i.e. the region for making bit line contact, of the semiconductor substrate 1. Then the whole surface is covered with the third insulating film 5, and a plurality of openings are providing in the third insulating film 5. Further, a conductive path is provided through the third insulating film 5 extending to the contact portion 6a of the conductive section 6.

To be summarized, an essential point of the first through fourth embodiments is a construction in which an etching stop material for oxide film such as nitride film is placed on a lower lead (transfer gate), and the etching stop material is removed in the peripheral circuit section for making aluminum contacts other than the memory cell array section. In the first and second embodiments, the silicon nitride film SiN is removed only around desired contacts in the peripheral circuit section which needs aluminum contracts, whereas in the third and fourth embodiments, the silicon nitride film SiN is left only around the bit line contact in the peripheral circuit section which needs aluminum contacts.

Fifth Embodiment

Figure 11:
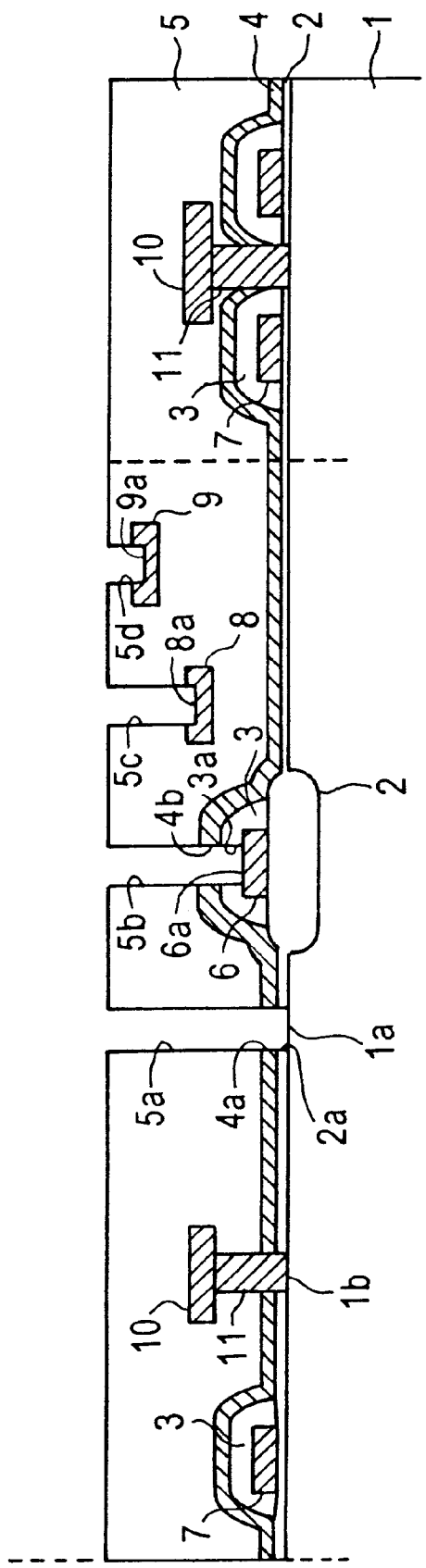
FIG. 11 is a cross sectional view for explaining a structure of a semiconductor device in accordance with the fifth embodiment of the invention.

FIG. 11 illustrates a sectional view of the structure of a semiconductor device according to the fifth embodiment of the invention. The illustrated semiconductor device (DRAM) is comprised of a memory cell array section A without aluminum contact, and peripheral circuit section B having a substrate, transfer gate, bit line, and aluminum contacts on a cell plate. In the drawing, same reference numerals as in FIG. 1 designate same or like parts respectively.

As shown in the drawing, the semiconductor device comprises a semiconductor substrate 1, a first insulating film (oxide film) 2, a second insulating film (oxide film) 3, a silicon nitride film 4, a third insulating film (interlayer insulating film) 5, a conductive section (transfer gate) 6 and a conductive section (word line) 7 on the first oxide film 2, a conductive section (bit line) 8 and a conductive section (cell plate) 9 buried at the middle position in the interlayer insulating film 5, a further conductive section (bit line) 10 buried at the middle position in the interlayer insulating film 5, and a contact passage 11 thereof.

The semiconductor substrate 1 has a number of elements formed on a principal plane thereof, and a contact portion 1a for contacting between the layers and a contact portion 1b for contacting the conductive section (bit line) 10 are shown herein. The first oxide film 2 is applied to the principal plane of the semiconductor substrate 1, and an opening 2a is provided in the contact portion 1a of the semiconductor substrate 1.

The second oxide film 3 is applied to cover the conductive sections 6 and 7 disposed on the first oxide film 2. The second oxide film 3 covering the conductive section 6 has an opening 3a provided in the contact portion 6a of the conductive section 6.

The silicon nitride film (SiN) 4 is applied to the first oxide film 2 and second oxide film 3, and has an opening 4a provided, in the contact portion 1a of the principal plan of the, semiconductor substrate 1 and an opening 4b provided in the contact portion 6a of the conductive section 6. This silicon nitride film 4 is formed for the purpose of self-alignment contact in the memory cell array section A and is simultaneously formed also in the peripheral circuit section B.

The interlayer/insulating film 5 is applied to the silicon nitride 4, and has an opening 5a provided in the contact portion 1a of the semiconductor substrate 1 and an opening 5b provided in the contact portion 6a of the conductive section 6. Further, an opening 5c is provided in a contact portion 8a of the conductive section 8 at the middle position buried in the interlayer insulating film 5, and an opening 5d is provided in a contact portion 9a of the conductive section 9.

The conductive section 6 is formed on a part of the first oxide film 2 to project from the first oxide film 2, and is a conductive part to be a word line serving as a transfer gate. The conductive section 7 is formed on a part of the first oxide film to project from the first oxide film 2, and is a conductive part to be a gate electrode or word line. The conductive section 8 is a conductive part serving as a bit line formed at a middle position in the interlayer insulating film 5 with a certain distance from the principal plane of he semiconductor substrate 1, and has a contact portion 8a. The conductive section 9 is a conductive part serving as a cell plate of a capacitor formed at the middle position in the interlayer insulating film 5 with a certain distance from the principal plane of the semiconductor substrate 1, and has a contact portion 9a. The conductive section 10 is a conductive part serving as a bit line formed, in the same manner as the conductive section 8, at another middle position buried in the interlayer insulating film 5, and has a contact passage 11.

In the memory cell array section A of this semiconductor device, there are bit line contact passage 11 serving as conductive path to the semiconductor substrate 1 and storage node contact (not shown), and herein a self-alignment technology is utilized.

On the other hand, in the peripheral circuit section B, there is a bit line contact passage 11 which is formed simultaneously with the bit line contact passage 11 of the memory cell array section A. Furthermore, in the openings 5a, 5b, 5c, 5d, of the interlayer insulating film 5, there are upper metal leads, so-called aluminum contacts, formed to serve as interlayer conductive paths, extending to the contact portion 1a of the semiconductor substrate 1, contact portion 6a of the conductive section 6, contact portion 8a of the conductive section 8 in the middle position, and contact portion 9a of the conductive section 9 in the middle position, respectively.

In this embodiment, in the semiconductor device manufactured by a blanket SiN type self-alignment method, the aluminum contacts are securely made to the contact portion of the semiconductor substrate and to the contact portion of the transfer gate through the silicon nitride film.

This embodiment may be also restated as follows. That is, in the semiconductor device according to this embodiment, an insulating film including the insulating films 2, 3, 5 is applied to the principal plane of the semiconductor substrate 1. Further, the silicon nitride film 4 is disposed in this insulating film so as to cover the principal plane of the semiconductor substrate 1 and the conductive section 6. Furthermore, a conductive path is provided through the insulating film and the silicon nitride film 4 extending to the contact portion 6a of the mentioned conductive section 6. Similarly, a conductive path is provided through the insulating film and silicon nitride film 4 extending to the contact portion 1a of the semiconductor substrate 1. The opening diameter of the silicon nitride film 4 is the same as the diameter of these conductive paths, and they are closely adjacent each other. In the insulating film, other conductive sections 8 and 9 are disposed, and conductive paths are respectively provided through the insulating film extending to the contact portions 8a and 9a of those conductive sections 8 and 9.

Sixth Embodiment

Figure 12:
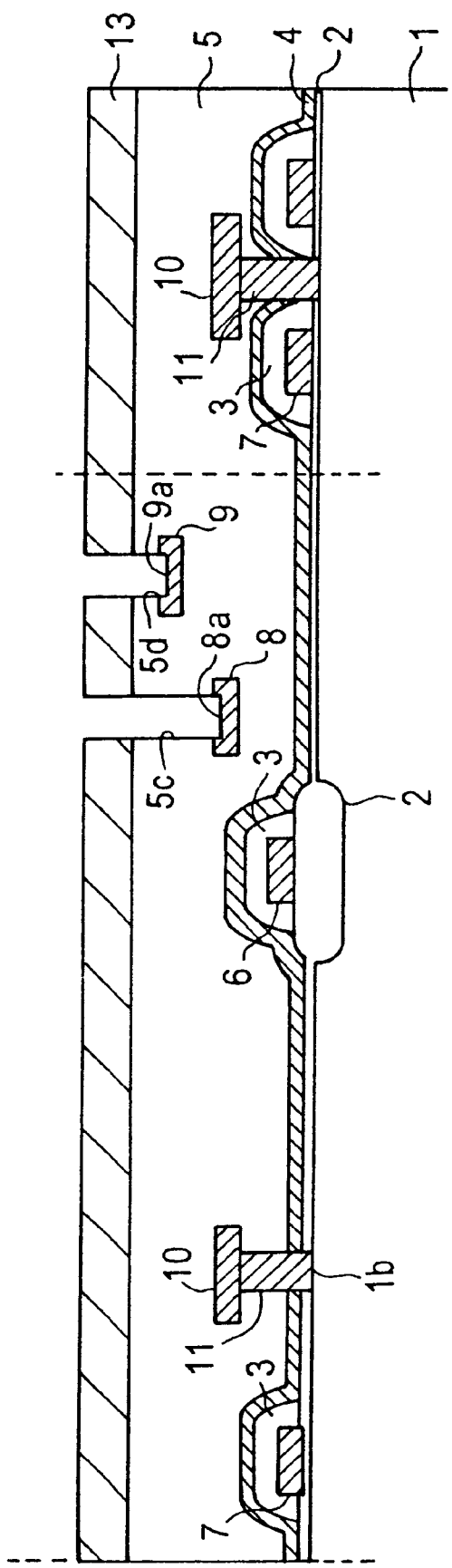
FIG. 12 through FIG. 14 are views for explaining a manufacturing method of a semiconductor device in accordance with the sixth embodiment of the invention.
Figure 13:
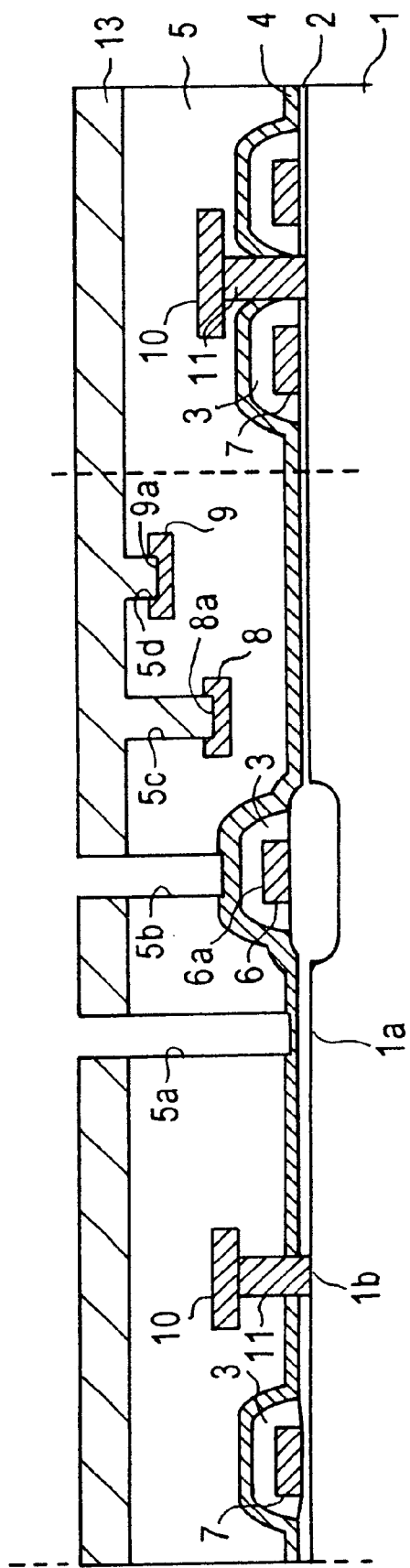
Figure 14:
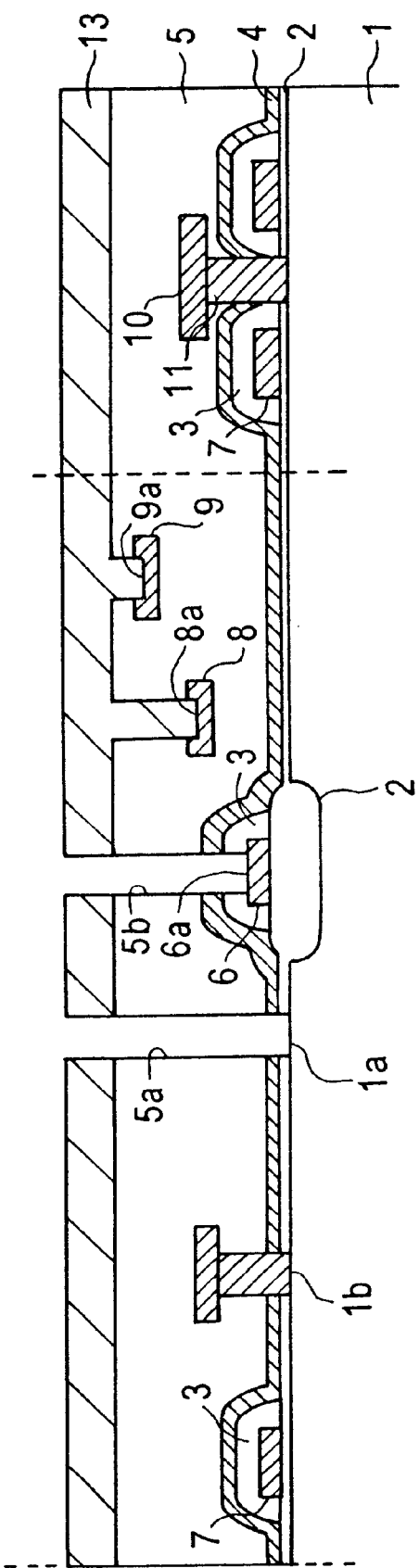

FIGS. 12 to 14 show a manufacturing process of a semiconductor device according to the sixth embodiment of the invention, and this manufacturing process is suitable for manufacturing the semiconductor device of the structure as described in the fifth embodiment. In the drawings, the same reference numerals as in FIG. 1 or FIG. 2 designate same or like parts.

Now the manufacturing process is described. As shown in FIG. 12, a first insulating film (oxide film) 2 is applied to the principal plane of the semiconductor substrate 1. On a part of this first oxide film 2, a conductive section (transfer gate) 6 and conductive section (word line) 7 are formed so as to project from the first oxide film 2. These conductive sections 6 and 7 are further covered with a second insulating film (oxide film) 3. Further, a silicon nitride film 4 is applied to the entire surface of the first oxide film 2 and second oxide film 3. This silicon nitride film 4 is formed self-alignment contact in the memory cell array section A, and is simultaneously formed also in the peripheral section B.

A third insulating film (silicon oxide film as interlayer insulating film) 5 is applied and flattened on the silicon nitride film 4. In this process, an opening is provided through the silicon nitride film 4 and the first oxide film 2 on the bit line contact portion 1b in the principal plane of the semiconductor substrate 1, and a bit line contact passage 11 is disposed therein. Further, he conductive section (bit line) 8 and conductive section (bit line) 10 are disposed at the middle positions with certain distances from the silicon nitride 4 on the principal plane of the semiconductor substrate 1, and a contact passage 11 extending to the semiconductor substrate 1 is formed from the conductive section 10. Furthermore, a conductive section (cell plate) 9 is likewise formed, and buried into the interlayer oxide film 5.

Thereafter, a resist 13 is applied, and openings are provided at the location of bit line 8 and cell plate 9 not covered with the silicon nitride film 4. The interlayer oxide film 5 is etched selectively, and thereby openings 5c, 5d extending to the contact portions 8a, 9a are formed.

Then, as shown in FIG. 13, the openings extending to the contact portions 8a and 9a of the bit line 8 and cell plate 9 are filled or covered with resist, and openings in the resist 13 are formed at the locations of the contact portion 1a of the semiconductor substrate 1 and the contact portion 6a of the transfer gate 6 covered with the silicon nitride film 4. Then, the interlayer oxide film 5 is etched selectively, and thereby openings extending to the silicon nitride film 4 are formed.

Subsequently, as shown in FIG. 14, from the opening 5a at the location of the contact portion 1a of the semiconductor substrate 1 and from the opening 5b at the location of the contact portion 6a of the transfer gate 6, the silicon nitride film 4 and silicon oxide film 2 are etched, and thereby openings 5a, 5b extending to the contact portion 1a and contact portion 6a are formed. Thereafter, the resist 13 is removed, and aluminum contacts are made to serve as conductive paths to the upper parts through these openings in the interlayer oxide film 5.

This embodiment shows a manufacturing process by a blanket SiN type self-alignment method in which openings for aluminum contacts are provided by etching in two steps using two masks. This process comprises a first opening step for the contacts on the bit line 8 and on the cell plate 9 not having a nitride film in the opened holes, and a second opening step for the contacts on the substrate 1 and transfer gate 6 having a nitride film in the opened holes. In the first step, an opening is performed just by oxide film dry etching, and in the second step, the oxide film dry etching is followed by a nitride film etching and base layer oxide film etching.

In this manner, the steps for opening the contact through a nitride film are performed by separate etching. Therefore it is possible to apply different etching specifications, whereby film thickness reduction or penetration of upper lead due to over-etching may be effectively prevented.

This embodiment may be also restated as follows. That is, in the manufacturing process according to this embodiment, the first insulating film 2 is applied on the principal plane of the semiconductor substrate 1, and the conductive section 6 is formed on the first insulating film 2. Then the conductive section 6 is covered with the second insulating film 3, and the first insulating film 2 and second insulating film 3 are covered with the silicon nitride film 4. The third insulating film 5 is applied to the silicon nitride film 4 surrounding another conductive section 8. An opening through the third insulating film 5 is provided to form a conductive path extending through the third insulating film 5 to the contact portion 8a of the another conductive section 8 openings are provided through the third insulating film 5 and silicon nitride film 4 to form a conductive path extending to the contact portion 6a of the conductive section 6 and a conductive path extending to the contact portion 1a of the semiconductor substrate 1 respectively.

Seventh Embodiment

Figure 15:
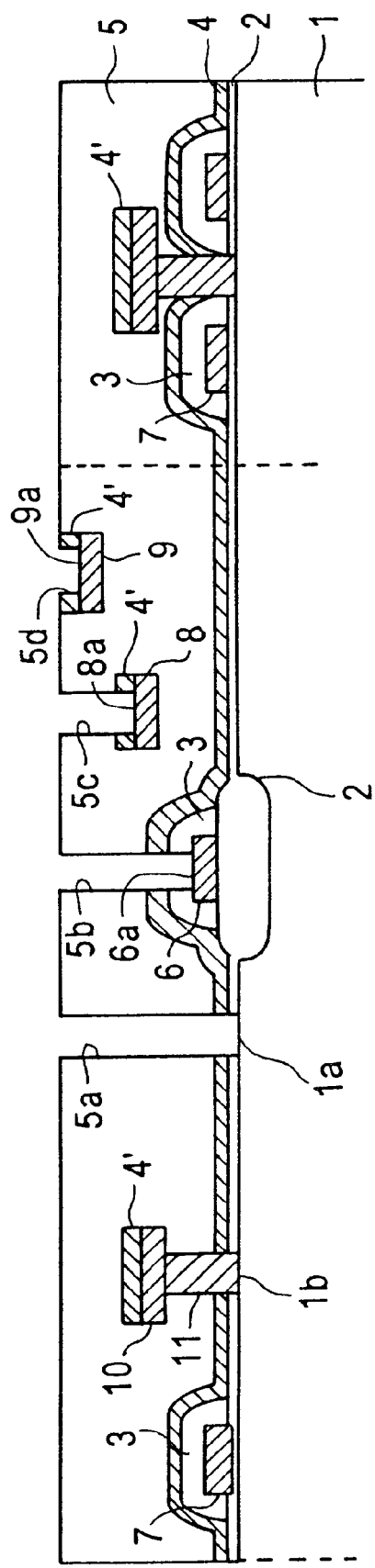
FIG. 15 is a cross sectional view for explaining the structure of the semiconductor device in accordance with the seventh embodiment of the invention.

FIG. 15 shows a sectional view of the structure of a semiconductor device according to the seventh embodiment of the invention. The illustrated semiconductor device (DRAM) is comprised of a memory cell array section A having no aluminum contact, and a peripheral circuit section B having a substrate, transfer gate, bit line, and aluminum contacts on a cell plate. In the drawing, same reference numerals as in FIG. 1 designate the same or like parts respectively.

As shown in the drawing, the semiconductor device comprises a semiconductor substrate 1, a first insulating film (oxide film) 2, a second insulating film (oxide film) 3, a silicon nitride film 4, a third insulating (interlayer insulating film) 5, a conductive section (transfer gate) 6 and a conductive section (word line) 7 on the first oxide film 2, a conductive section (bit line) 8 and a conductive section (cell plate) 9 buried at the middle position in the interlayer insulating film 5, and a contact passage 11 thereof.

The semiconductor substrate 1 has a number of elements formed on a principal plane thereof, and a contact portion 1a for contacting between the layers and a contact portion 1b for contacting the conductive section 10 are shown herein. The first oxide film 2 is applied to the principal plane of the semiconductor substrate 1, and an opening 2a is provided in the contact portion 1a of the semiconductor substrate 1.

The second oxide film 3 is applied to cover the conductive sections 6 and 7 disposed on the first oxide film 2. The second oxide film 3 covering the conductive section 6 has an opening 3a provided in the contact portion 6a of the conductive section 6.

The silicon nitride film (SiN) 4 is applied to the first oxide film 2 and second oxide film 3, and has an opening 4a provided in the contact portion 1a of the principal plan of the semiconductor substrate 1 and an opening 4b provided in the contact portion 6a of the conductive section 6. This silicon nitride film 4 is formed for the purpose of self-alignment contact in the memory cell array section A and is simultaneously formed also in the peripheral section B.

The interlayer insulating film 5 is applied to the silicon nitride film 4, and has an opening 5a provided in the contact portion 1a of the semiconductor substrate 1 and an opening 5b provided in the contact portion 6a of the conductive section 6. Further, an opening 5c is provided in a contact portion 8a of the conductive section 8 at the middle position buried in the interlayer insulating film 5, and an opening 5d is provided in a contact portion 9a of the conductive section 9.

The conductive section 6 is formed on a part of the first oxide film 2 to project from the first oxide film 2, and is a conductive part to be a word line serving as a transfer gate. The conductive section 7 is formed on a part of the first oxide film to project from the first oxide film 2, and is a conductive part to be a gate electrode or word line. The conductive section 8 is a conductive part serving as a bit line formed at a middle position in the interlayer insulating film 5 with a certain distance from the principal plane of the semiconductor substrate 1, and has a contact portion 8a. A silicon nitride film 4' is applied to the upper surface of the conductive section 8, and an opening is provided at the location of the contact portion 8a of the conductive section 8.

The conductive section 9 is a conductive part serving as a cell plate of the capacitor formed at the middle position in the interlayer insulating film 5 with a certain distance from the principal plane of the semiconductor substrate 1, and has a contact portion 9a. A silicon nitride film 4' is applied to the upper surface of the conductive section 9, and an opening is provided at the location of the contact portion 9a of the conductive section 9. The conductive section 10 is a conductive part serving as a bit line formed, in the same manner as the conductive section 8, at another middle position buried in the interlayer insulating film 5, and has a contact passage 11.

In the memory cell array section A of this semiconductor device, there are bit line contact passages 11 serving as conductive paths to the semiconductor substrate 1 and storage node contact (not shown), and herein a self-alignment technology is utilized.

On the other hand, in the peripheral circuit section B, a bit line contact passage 11 is formed simultaneously with the bit line contact passage 11 of the memory cell array section A. Furthermore, in the openings 5a, 5b, 5c, 5d of the interlayer insulating film 5, the upper metal leads, so-called aluminum contacts, are formed to serve as interlayer conductive paths, extending to the contact portion 1a of the semiconductor substrate 1, contact portion 6a of the conductive section 6, contact portion 8a of the conductive section 8 in the middle position, and contact portion 9a of the conductive section 9 in the middle position, respectively.

In the structure according to this embodiment, the silicon nitride film is placed on all leads and substrate where aluminum contacts are to be formed. The aluminum contact holes are once received by the nitride film, and after removing the nitride film by varying the gas and etching conditions, the contact holes are formed by applying a slight oxide film etching.

In this embodiment, the aluminum contacts may securely formed to serve as conductive paths to the upper layer in such a manner as to securely pass through the silicon nitride film 4 used in the self-alignment contact. Further, since every conductive section is similarly covered with silicon nitride film, the conductive sections may be processed and treated in like manner.

This embodiment may be also restated as follows. That is, in the semiconductor device according to this embodiment, an insulating film including the insulating films 2,3,5, is applied to the principal plan of the semiconductor substrate 1, and in this semiconductor film, the conductive section 6 is disposed near the principal plan of the semiconductor substrate 1. Further, the silicon nitride film 4 is disposed in this insulating film so as to cover the principal plan of the semiconductor substrate 1 and the conductive section 6. Furthermore, a conductive path is provided through the insulating film and the silicon nitride film 4 extending to the contact portion 6a of the conductive 6. Similarly, a conductive path is provided through the insulating film and silicon nitride film 4 extending to the contact portion 1a of the semiconductor substrate 1. The opening diameter of the silicon nitride film 4 is the same as the diameter of these conductive paths, and they are closely adjacent each other. In the insulating film, other conductive sections 8 and 9 to which the silicon nitride film 4' is applied are disposed, and conductive paths are respectively provided through the insulating film and the silicon nitride film 4' extending to the contact portions 8a and 9a of those conductive sections 8 and 9.

In the semiconductor devices according to the foregoing first, third, fifth and seventh embodiments, the silicon nitride film is formed for the self-alignment contact in the blanket SiN method in the memory cell array section, and leads, i.e., so called aluminum contacts are provided from the upper layer through the silicon nitride film formed simultaneously in the peripheral circuit section. More specifically, in the first and third embodiments among these embodiments, the size of the opening of the silicon nitride film is larger than that of the conductive paths with sufficient allowance, i.e., larger than the size of the diameter of the aluminum contact holes. On the other hand, in the fifth and seventh embodiments, the size of the opening of the silicon nitride film is same as that of the conductive paths, i.e., same as the size of the diameter of the aluminum contact holes.

Eighth Embodiment

Figure 16:
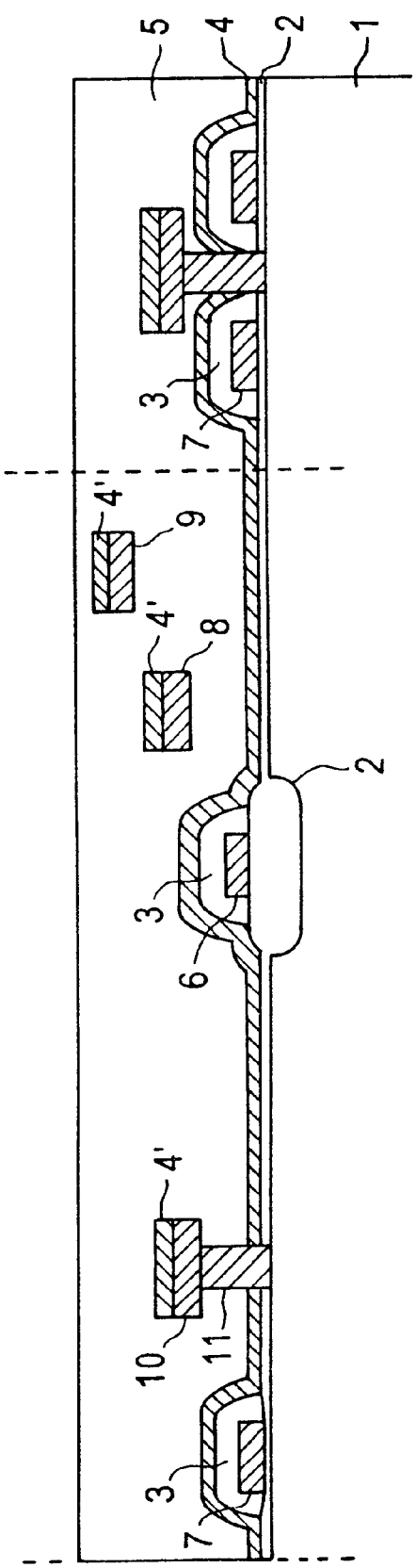
FIG. 16 through FIG. 18 are views for explaining the manufacturing method of the semiconductor device in accordance with the eighth embodiment of the invention.
Figure 17:
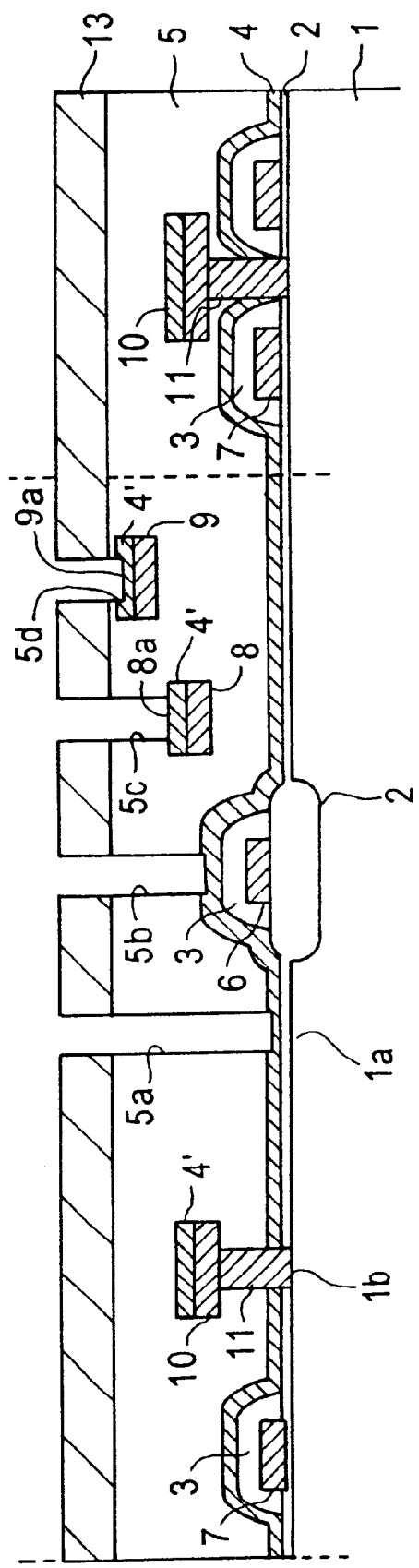
Figure 18:
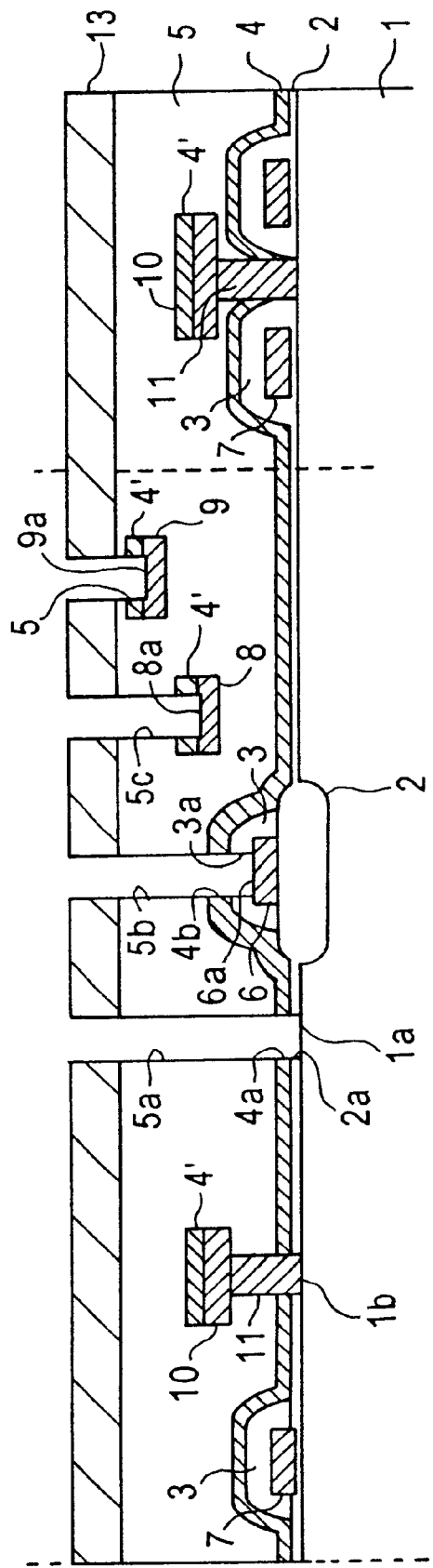

FIGS. 16 to 18 illustrate a manufacturing process of a semiconductor device according to the eighth embodiment of the invention, and this manufacturing process is suitable for manufacturing the semiconductor device of the structure as described in the seventh embodiment. In the drawings, the same reference numerals as in FIG. 1 or FIG. 2 designate same or like parts.

Now the manufacturing process is described. As shown in FIG. 16, a first insulating film (oxide film) 2 is applied to the principal plane of the semiconductor substrate 1. On a part of this first oxide film 2, a conductive section (transfer gate) 6 and a conductive section (word line) 7 are formed so as to project from the first oxide film 2. These conductive sections 6 and 7 are further covered with a second insulating film (oxide film) 3. Further, a silicon nitride film 4 is applied to the entire surface of the first oxide film 2 and second oxide film 3. This silicon nitride film 4 is formed for self-alignment contact in the memory cell array section A, and is simultaneously formed also n the peripheral section B.

A third insulating film (silicon oxide film as an interlayer insulating film) 5 is applied and flattened on the entire surface of the silicon nitride film 4. In this process, an opening is provided through the silicon nitride film 4 and the first oxide film 2 on the bit line contact portion 1b in the principal plane of the semiconductor substrate 1, and a bit line contact passage 11 is disposed therein. Further, the conductive section (bit line) 8 and conductive section (bit line) 8 and conductive section (bit line) 10 are disposed at the middle position with a certain distance from the silicon nitride film 4 on the principal plane of the semiconductor substrate 1. The silicon nitride film 4' is applied to the upper surface of the bit lines 8 and 10. Furthermore, the conductive section (cell plate) 9 is disposed likewise in the interlayer oxide film 5 on which upper surface the silicon nitride films 4' is applied.

Thereafter, as shown in FIG. 17, a resist 13 is applied to the entire surface of the interlayer oxide film 5, and openings are provided through this resist 13 at the positions corresponding to the contact portion 1a of the semiconductor substrate 1, contact portion 6a of the conductive section 6, contact portion 8a of the bit line 8, and contact portion 9a of the cell plate 9. Then the interlayer oxide film 5 is selectively etched from these openings, whereby openings 5a, 5b, 5c, 5d are formed reaching to the silicon nitride films 4 or 4'.

Subsequently, as shown in FIG. 18, the silicon nitride film 4 is etched from these openings, thereby forming openings extending respectively to the contact portion 8a of the bit line 8 and the contact portion 9a of the cell plate 9. In the openings in the contact portion 1a of the semiconductor substrate 1 and the contact portion 6a of the conductive section 6, the silicon nitride film 4 is removed, but the oxide film 2 or 3 still remains. Therefore the remaining oxide film is removed by subsequent oxide interlayer insulating film) 5 is applied and flattened on the entire surface of the silicon nitride film 4. In this process, an opening is provided through the silicon nitride film 4 and the first oxide film 2 on the bit line contact portion 1b in the principal plane of the semiconductor substrate 1, and a bit line contact passage 11 is disposed therein. Further, the conductive section (bit line) 8 and conductive section 9 bit line) 10 are disposed at the middle position with a certain distance from the silicon nitride film 4 on the principal plane of the semiconductor substrate 1. The silicon nitride film 4' is applied to the upper surface of the bit lines 8 and 10. Furthermore, the conductive section (cell plate) 9 is disposed likewise in the interlayer oxide film 5 on which upper surface the silicon nitride films 4' is applied.

Thereafter, as shown in FIG. 17, a resist 13 is applied to the entire surface of the interlayer oxide film 5, and openings are provided through this resist 13 at the positions corresponding to the contact portion 1a of the semiconductor substrate 1, contact portion 6a of the conductive section 6, contact portion 8a of the bit line 8, and contact portion 9a of the cell plate 9. Then the interlayer oxide film 5 is selectively etched from these openings, whereby openings 5a, 5b, 5c, 5d are formed reaching to the silicon nitride films 4 or 4'.

Subsequently, as shown in FIG. 18, the silicon nitride film 4 is etched from these openings, thereby forming openings extending respectively to the contact portion 8a of the bit line 8 and the contact portion 9a of the cell plate 9. In the openings in the contact portion 1a of the semiconductor substrate 1 and the contact portion 6a of the conductive section 6, the silicon nitride film 4 is removed, but the oxide film 2 or 3 still remains. Therefore the remaining oxide film is removed by subsequent oxide film etching, thereby the openings 5a and 5b are formed reaching to the contact portion 1a and contact portion 6a, respectively. Thereafter, the resist 13 is removed, and aluminum contacts are made to serve as conductive paths to the upper parts through these openings in the interlayer oxide film 5.

In the manufacturing process according to this embodiment, the silicon nitride film is place on all leads and substrate where aluminum contacts are to be formed. The aluminum contact holes are once received by the nitride film and after removing the nitride film by varying the gas and etching conditions, the contact holes are accomplished by applying a slight oxide film etching.

In this manner, it is certain that shallow contacts receives a rather longer etching time than required as compared with deep contacts such as substrate contacts. Nevertheless, there is an advantage that the leads are not cut off because they are covered with a nitride film serving as an etching stopper.

This embodiment may be also restated as follows. That is, in the manufacturing process according to this embodiment, the first insulating film 2 is applied on the principal plane of the semiconductor substrate 1, and the conductive section 6 is formed on this first insulating film 2. Then the conductive section 6 is covered with the second insulating film 3, and further the first insulating film 2 and second insulating film 3 are covered with the silicon nitride film 4. Next, the third insulating film 5 is applied to the silicon nitride film 4 surrounding another conductive section 8 to which another silicon nitride film is applied. An opening is provided through the third insulating film 5 to form a conductive path extending through the third insulating film 5 toward the contact portion 6a of the conductive section 6 up to the silicon nitride film 4. An opening is provided through the third insulating film 5 to form a conductive path extending through the third insulating film 5 toward the contact portion 8a of the conductive section 8 up to the silicon nitride film 4'. A conductive path is provided extending from the opening through the silicon nitride film 4 and second insulating film 2 to the contact portion 6a of the conductive section 6. A conductive path is provided extending from the opening through another silicon nitride film 4' to the contact portion 8a of another conductive section 8.

In the manufacturing process of a semiconductor device according to the foregoing second, fourth, sixth and eighth embodiments, the silicon nitride film 4 is formed for self-alignment contact in a blanket SiN method in the memory cell array section A, and the silicon nitride film 4 is formed simultaneously in the peripheral circuit section B. So-called aluminum contacts are formed by providing conducting leads from the upper layer through the silicon nitride film 4. More specifically, in the second and fourth embodiments among these embodiments, the silicon nitride film 4 is preliminarily removed at the region for making the aluminum contacts in the peripheral circuit section B. Then, the interlayer oxide film 5 is applied thereto, and thereafter the conductive paths, i.e., aluminum contacts are formed through the interlayer oxide film 5. On the other hand, in the sixth and eighth embodiments, the interlayer oxide film 5 is allied to the silicon nitride film 4 also in the peripheral circuit section B, and then the conductive paths, i.e., aluminum contacts are formed through the interlayer oxide film 5 and silicon nitride 4.

Ninth Embodiment

Figure 19:
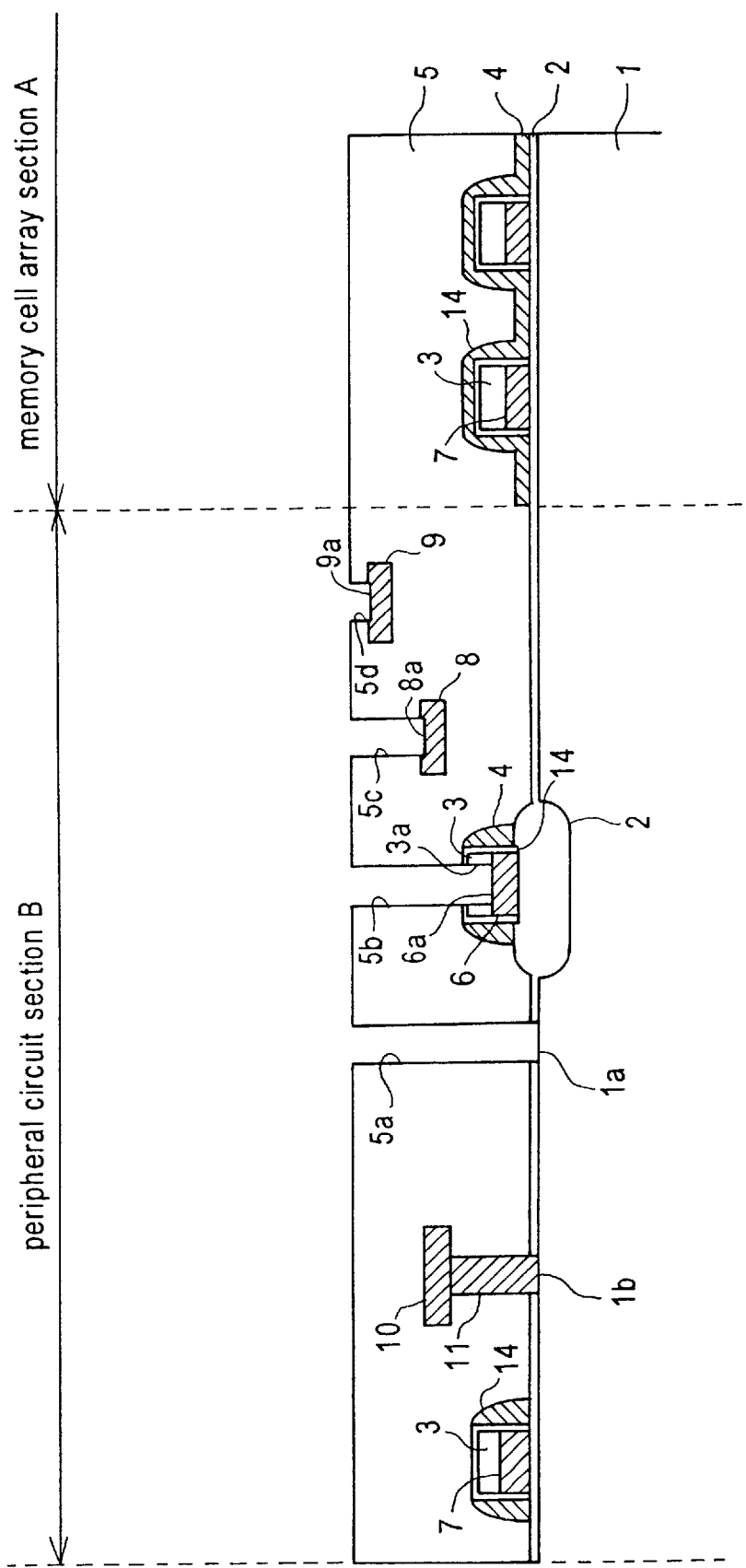
FIG. 19 is a cross sectional view for explaining a structure of the semiconductor device in accordance with the ninth embodiment of the invention.

FIG. 19 illustrates a sectional view of the structure of a semiconductor device according to the ninth embodiment of this invention. The illustrated semiconductor device (DRAM) is comprised of a memory cell array section A having no aluminum contact, and a peripheral circuit section B having a substrate, transfer gate, bit line, and aluminum contact on a cell plate. In the drawing, the same reference numerals as in FIG. 1 designate same or like parts respectively.

As shown in the drawing, the semiconductor device comprises a semiconductor substrate 1, a first insulating film (oxide film) 2, a second insulating film (oxide film) 3, a silicon nitride film 4, a third insulating film (interlayer insulating film) 5, a conductive section (transfer gate) 6 and a conductive section (word line) 7 on the first oxide film 2. Also comprising the device are, a conductive section (bit line) 8 and a conductive section (cell plate) 9 buried at the middle position in the interlayer insulating film 5, a further conductive section (bit line) 10 buried at the middle position in the interlayer insulating film 5, and a contact passage 11 thereof and a thin fifth insulating film (oxide film) 14.

The semiconductor substrate 1 has a number of elements formed on a principal plane thereof, and a contact portion 1a for contacting between the layers and a contact portion 1b for contacting the conductive section 10 are shown herein. The first oxide film 2 is applied to the principal plan of the semiconductor substrate 1, and is opened at the location through which the bit line contact passage 11 extends. The second oxide film 3 is applied to the upper surface of the conductive section 6 and 7. The second oxide film 3 covering the upper surface of the conductive section 6 has an opening 3a located at the contact portion 6a of the conductive section 6.

The fifth oxide film 14 is thinly applied to the side surface of the conductive sections 6 and 7, and to the side and upper surface of the oxide film 3 thereon. This fifth oxide film 14 is not always essential, and may be omitted.

The silicon nitride film 4 (SiN) is applied to the first oxide film 2 and a fourth oxide film in the memory cell array section A. On the other hand, the silicon nitride film 4 is applied only on the rising portion of the fifth oxide film 14 serving as the side faces of the conductive sections 6 and 7 in the peripheral circuit section B having aluminum contacts. The silicon nitride film 4 is formed for the purpose of self-alignment contact in the memory cell array section A, and is simultaneously formed also in the peripheral section B.

The interlayer insulating film 5 is applied to the first oxide film 2, fifth oxide film 14 and silicon nitride film 4, and has an opening 5a provided at the contact portion 1a of the semiconductor substrate 1 and an opening 5b provided at the contact portion 6a of the conductive section 6. Further, an opening 5c is provided at a contact portion 8a of the conductive section 8 disposed at a middle position buried in the interlayer insulating film 5, and an opening 5d is provided at a contact portion 9a of the conductive section 9 disposed at a middle position.

The conductive section 6 is formed so as to project from the first oxide film 2, and is a conductive part to be a word line serving as a transfer gate. The conductive section 7 is a conductive part to be a gate electrode or word line. The conductive section 8 is a conductive part serving as a bit line disposed at a middle position buried in the interlayer insulating film 5 and has a contact portion 8a.

The conductive section 9 is a conductive part serving as a cell plate of a capacitor disposed at the middle position buried in the interlayer insulating film 5, and has a contact portion 9a. The conductive section 10 is a conductive part serving as a bit line, in the same manner as the conductive section 8 at another middle position buried in the interlayer insulating film 5, and has a contact passage 11 to the semiconductor substrate 1.

In the memory cell array section A of this semiconductor device, there are bit line contact passages 11 serving as conductive paths to the semiconductor substrate 1 and a storage node contact (not shown), and herein a self-alignment technology is utilized.

On the other hand, in the peripheral circuit section B, there is a bit line contact passage 11 which is formed simultaneously with the bit line contact passage 11 of the memory cell array section A. Furthermore, in the openings 5a, 5b, 5c, 5d of the interlayer insulating film 5, the upper metal leads, so-called aluminum contacts, are formed to serve as interlayer conductive paths, extending to the contact portion 6a of the conductive section 6, contact portion 8a of the conductive section 8 in the middle position, and contact 9a of the conductive section 9 in the middle position, respectively.

In this embodiment of the side wall SiN type self-alignment method, the side wall oxide film 14 of the transfer gate 6 is thinly disposed, and, in the peripheral circuit section B having aluminum contacts, the nitride film 4 is left only on the side wall of the transfer gate 6.

As a result, any mask to be used may be a rough mask capable of leaving only in the memory cell array section A. It is easier to perform a patterning as compared with the other masks for removing or leaving only the periphery of the contact. Furthermore, the nitride film 4 used in self-alignment is removed from all aluminum contacts in the peripheral circuit section B, and thereby the problem of etching stop on the nitride film is overcome.

This embodiment may be also restated as follows. That is, in the semiconductor device according to this embodiment, an insulating film including the insulating films 2, 3 and 5 is applied to the semiconductor substrate 1 having contact portions on the principal plane, and in this semiconductor film, the conductive section 6 is disposed near the principal plane of the semiconductor substrate 1 so as to project from the principal plane. Further, in the peripheral circuit section B, the silicon nitride film 4 is applied to the side face of the conductive section 6. Similarly, another conductive path is provided through the insulating film extending to the contact portion 1a of the semiconductor substrate 1. In the insulating film, further conductive sections 8 and 9 are disposed, and conductive paths are provided through the insulating film extending to the contact portions of the conductive sections.

Tenth Embodiment

FIGS. 20 to 24 show a manufacturing process of a semiconductor device according to the tenth embodiment of this invention, and this manufacturing process is suitable for manufacturing the semiconductor device of the structure as described in the ninth embodiment. In the drawings, the same reference numerals as in FIG. 1 or FIG. 2 designate same or like parts.

Figure 20:
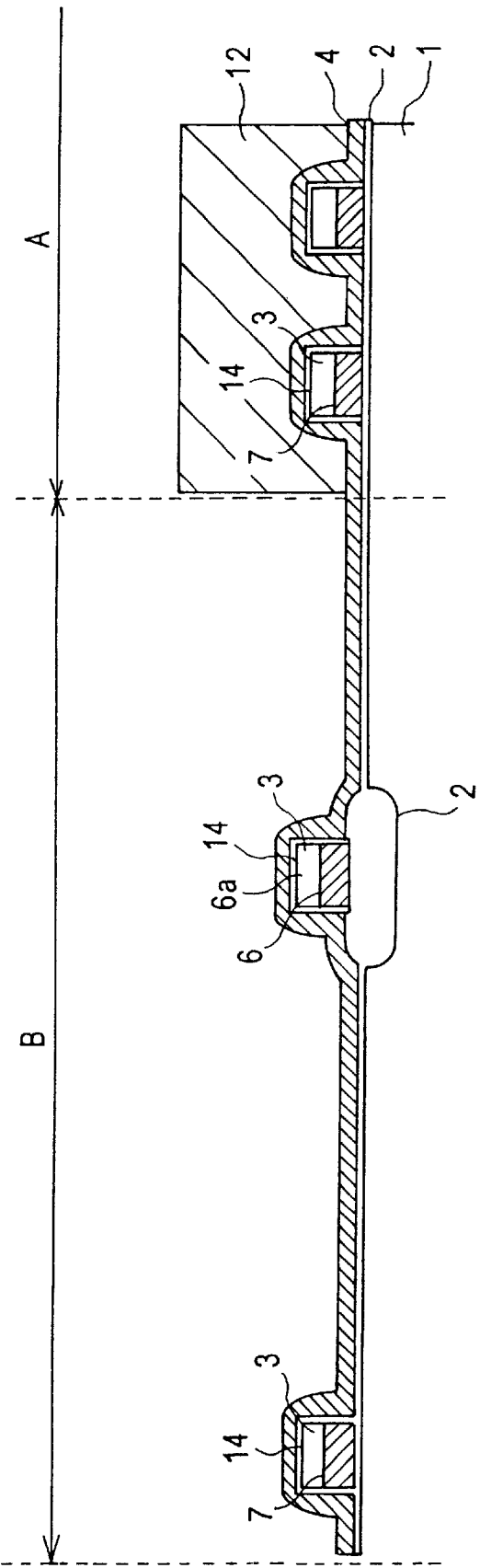
FIG. 20 through FIG. 24B are views for explaining the manufacturing method of the semiconductor device in accordance with the tenth embodiment of the invention.

Now the manufacturing process is described. As shown in FIG. 20, a first insulating film (oxide film) 2 is applied to the principal plane of the semiconductor substrate 1. On a part of this first oxide film 2, a conductive section (transfer gate) 6 and a conductive section (word line) 7 are formed so as to project from the first oxide film 2. Then, upper surfaces of the conductive sections 6 and 7 are further covered with a second insulating film (oxide film) 3. The fifth insulating film (oxide film) 14 is applied thinly to the conductive sections 6 and 7 and to the peripheral side face and upper surface of the second oxide film 3 thereon.

A silicon nitride film 4 is applied to the entire surface of the second oxide film 2 and the fifth oxide film 14. This silicon nitride film 4 is applied to the entire surface of the second oxide film 2 and the fifth oxide film 14. This silicon nitride film 4 is formed for self-alignment contact in the memory cell array section A, and is simultaneously formed also in the peripheral section B. After covering the entire surface with a resist 12, the resist is removed from the peripheral circuit section B wherein aluminum contacts are to be made, while the resist 12 is left in the memory cell array section A.

Figure 21:
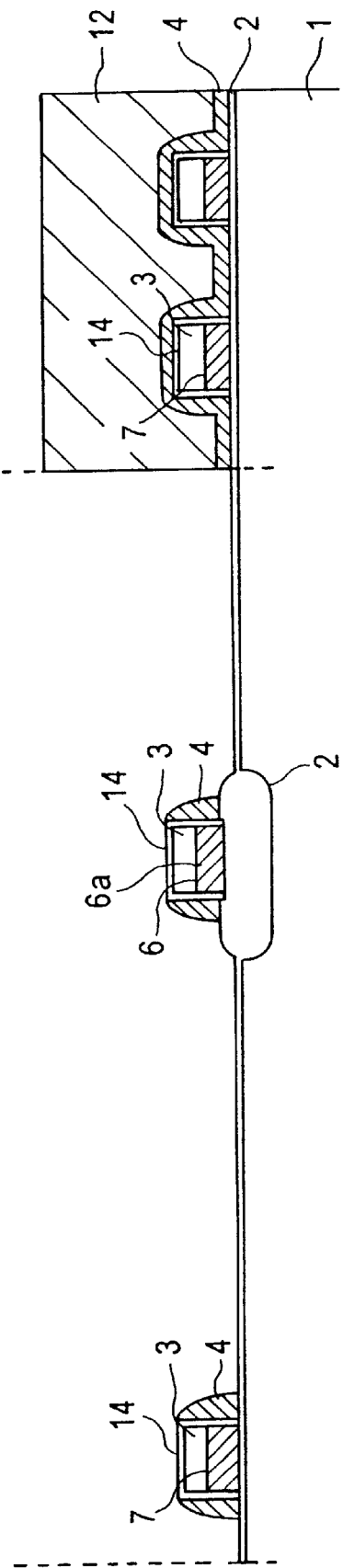
Figure 24A:
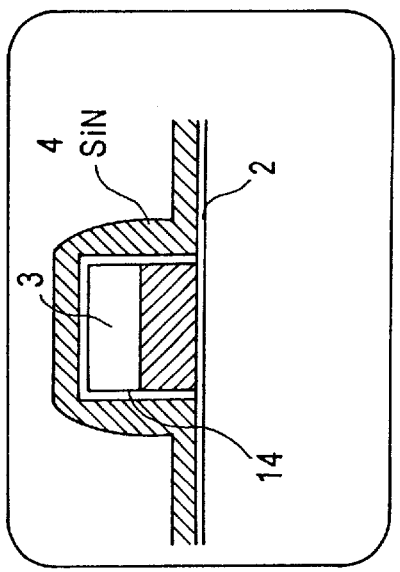
Figure 24B:
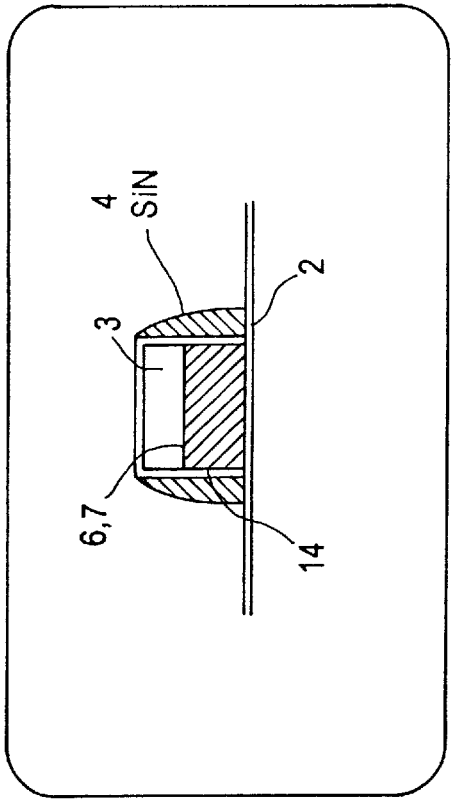

Further, as shown in FIG. 21, in the peripheral circuit section B where the resist 12 was removed, the silicon nitride film 4 is left only on the side faces of the conductive sections 6 and 7 while being removed by anisotropic etching from the other area. In this manner, the conductive section 7 in the memory cell array section A and the conductive sections 6 and 7 in the peripheral circuit section B are formed respective as shown in FIG. 24(a) and 24(b).

Figure 22:
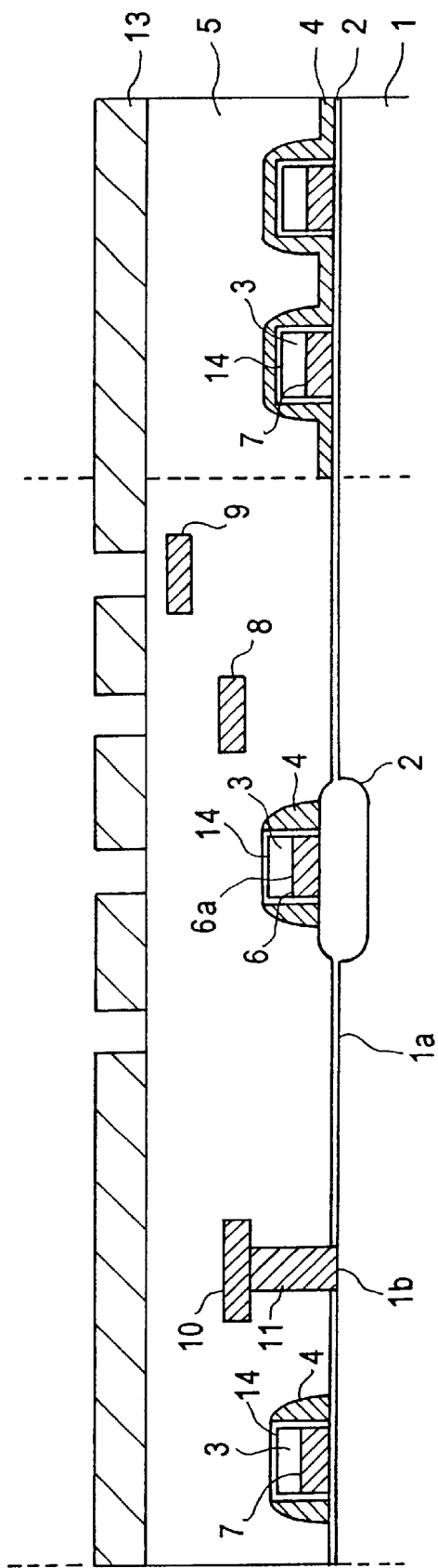

Then, as shown in FIG. 22, a third insulating film (silicon oxide film serving as an interlayer insulating film) 5 is applied and flattened on the entire surface of the semiconductor substrate 1 including the upper surface of the first oxide film 2, silicon nitride film 4 and fifth oxide film 14. In this process, an opening is provided through the first oxide film 2 on the bit line contact portion 1b on the principal plane of he semiconductor substrate 1, and the bit line contact passage 11 is disposed. Further, the conductive section (bit line) 8 and conductive section (bit line) 10 are disposed at the middle position in the interlayer oxide film 5. Furthermore, the conductive section (cell plate) 9 is similarly disposed and buried in the interlayer oxide film 5. Thereafter, a resist 13 is applied to the entire surface, and openings are provided at the portions where aluminum contacts are required from above.

Figure 23:
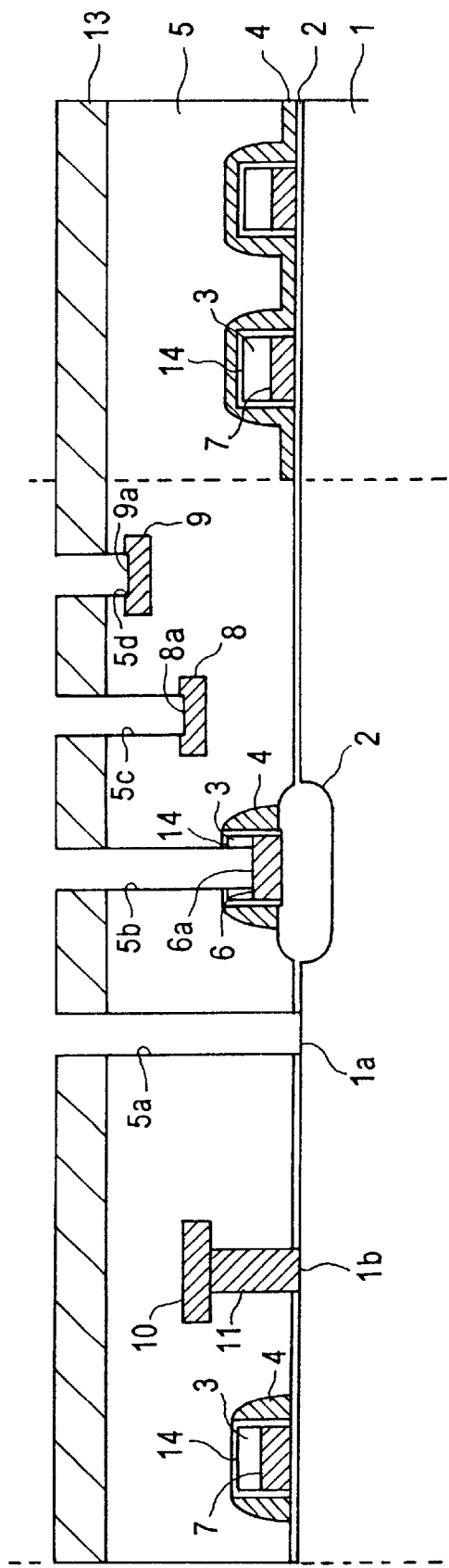

Subsequently, as shown in FIG. 23, the interlayer oxide film 5 is selectively etched from the openings of the resist 13, whereby holes are formed to provide conductive paths to the contact portion 1a of the semiconductor substrate 1, the contact portion 6a of the conductive section 6, the contact portion 8a of the word line 8, and the contact portion 9a of the cell plate 9. Then, the first oxide film 2 on the contact portion 1a of the semiconductor substrate 1 and the third oxide film 3 and fifth oxide film 14 on the conductive section 6 are etched at the same time. Thereafter, the resist 13 is removed, and aluminum contacts serving as conductive paths to the upper parts are formed in theses openings formed in the interlayer oxide film 5.

Thus, in this embodiment, after forming the conductive section (transfer gate) 6, the thin oxide film 14 and nitride film 4 are formed accurately (conformably) in the form of gate electrode shape of the conductive section (transfer gate) 6. After patterning the resist 13 in the memory cell array section A, the nitride film 4 is anisotropically dry-etched in the peripheral circuit section B. In the anisotropic dry etching, etching takes place only in the perpendicular direction, so that the nitride film 4 thick in the longitudinal direction on the side surface of the conductive section (transfer gate) 6 is left only as the side wall.

In this embodiment, any mask to be used for selectively etching the silicon nitride film 4 may be a rough mask capable of leaving only in the memory cell array section A. It is easier to perform a patterning as compared with the other mask for removing or leaving only at the periphery of the aluminum contact. Further, the nitride film 4 used in self-alignment is removed from all aluminum contacts n the peripheral circuit section B, and thereby the problem of etching stop in the nitride film is overcome.

In this embodiment, furthermore, the area where the silicon nitride film is left in the peripheral circuit section B having aluminum contact is minimized other than at the memory cell array section A. As a result of minimizing the silicon nitride film of high dielectric constant disposed among the leads in the peripheral circuit section B having aluminum contacts there is an advantage that the capacity among the leads may be reduced, and the electric characteristics, particularly operating speed, may be improved.

This embodiment may be also restated as follows. That is, in the manufacturing process according to this embodiment, the first insulating film 2 is applied on the principal plan of the semiconductor substrate 1, and the conductive section 6 is formed on this first insulating film 2. Then the conductive section 6 is covered with the second insulating film 3, and the first insulating film 2 and second insulating film 3, and the first insulating film 3 and second insulating film 3, are covered with the silicon nitride film 4. A third insulating film 5 is applied after removing the silicon nitride film 4 while leaving the same on the side face of the conductive section 6, and openings are provided through the third insulating film 5 to form a conductive path extending through the third insulating film 5 to the contact portion 6a of the conductive section 6 and another conductive path extending to the contact portion 1a of the semiconductor substrate 1 respectively.

Eleventh Embodiment

Figure 25:
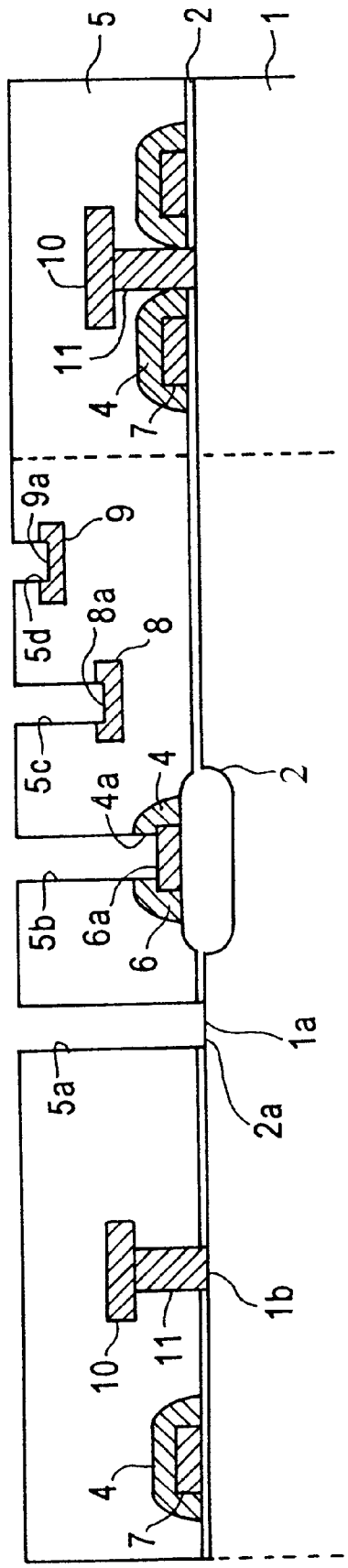
FIG. 25 is a cross sectional view for explaining a structure of a semiconductor device in accordance with the eleventh embodiment of the invention.

FIG. 25 illustrates a sectional view of the structure of a semiconductor device according to the eleventh embodiment of this invention. The illustrated semiconductor device (DRAM) is comprised of a memory cell array section A having no aluminum contact, and a peripheral circuit section B having a substrate, transfer gate, bit line, and aluminum contact on a cell plate. In the drawing, same reference numerals as in FIG. 1 designate same or like parts respectively.

As shown in the drawing, the semiconductor device comprises a semiconductor substrate 1, a first insulating film (oxide film) 2, a silicon nitride film 4, a third insulating film (interlayer insulating film) 5, a conductive section (transfer gate) 6 and conductive section (word line) 7 on the first oxide film 2, a conductive section (bit line) 8 and a conductive section (cell plate) 9 buried at the middle position in the interlayer insulating film 5, a further conductive section (bit line) 10 buried at the middle position in the interlayer insulating film 5, and a contact passage 11 thereof.

The silicon nitride film (SiN) 4 is formed to cover the conductive sections 6 and 7 on the first oxide film 2. The silicon nitride film 4 covering the conductive section 6 has an opening 4a provided at the contact portion 6a of the conductive section 6. This silicon nitride 4 is formed for the purpose of self-alignment contact in the memory cell array section A and is simultaneously formed also in the peripheral section B.

The interlayer insulating film 5 is applied to the first oxide film 2 and silicon nitride film 4, and has an opening 5a provided at the contact portion 1a of the semiconductor substrate 1 and an opening 5b provided at the contact portion 6a of the conductive section 6. Further, an opening 5c is provided at a contact portion 8a of the conductive section 8 disposed at the middle position and buried in the interlayer insulating 5, and an opening 5d is provided at a contact portion 9a of the conductive section 9.

The conductive section 6 is formed on a part of the first oxide film 2 to project from the first oxide film 2, and is a conductive part to be a word line serving as a transfer gate. The conductive section 7 is formed on a part of the first oxide film to project from the first oxide film 2, and is a conductive part to be a gate electrode or word line. The conductive section 8 is a conductive part serving as a bit line formed at a middle position in the interlayer insulating film 5 with a certain distance from the principal plane of the semiconductor substrate 1, and has a contact portion 8a. The conductive section 9 is a conductive part serving as a cell plate of the capacitor formed at the middle position in the interlayer insulating film 5 with a certain distance from the principal plane of the semiconductor substrate 1, and has a contact portion 9a. The conductive section 10 is a conductive part serving as a bit line formed, in the same manner as the conductive section 8, at another middle position buried in the interlayer insulating film 5, and has a contact passage 11.

In the memory cell array section A of this semiconductor device, there are bit line contact passage 11 serving as a conductive path to the semiconductor substrate 1 and a storage node contact (not shown), and herein a self-alignment technology is utilized.

On the other hand, in the peripheral circuit section B, there is a bit line contact passage 11 which is formed simultaneously with the bit line contact passage 11 of the memory cell array section A. Further, in the openings 5a, 5b, 5c, 5d of the interlayer insulating film 5, the upper metal leads, so-called aluminum contacts, are formed to serve as interlayer conductive paths, extending to the contact portion 1a of the semiconductor substrate 1, contact portion 6a of the conductive section 6, contact position, and contact portion 9a of the conductive section 9 in the middle position, respectively.

In this embodiment, furthermore, the area where the silicon nitride film is left in the peripheral circuit section B is minimized except the memory cell array section A. As a result of minimizing the silicon nitride film of high dielectric constant disposed among the leads in the peripheral circuit section B, there is an advantage such that the capacity among the leads may be reduced, and the electric characteristics, particularly operating speed, may be improved.

This embodiment may be also restated as follows. That is, in the semiconductor device according to this embodiment, an insulating film including the insulating films 2 and 5 applied to the semiconductor substrate 1 having contact portions on the principal plane. In this semiconductor film, the conductive section 6 is disposed near the principal plane of the semiconductor substrate 1 and is projecting from the principal plane. The silicon nitride film 4 is applied to the upper surface and side surface of the conductive section 6. Similarly, another conductive path is provided through the insulating film 5 extending to the contact portion 1a of the semiconductor substrate 1. In the insulating film, further conductive sections 8 and 9 are disposed, and conductive paths are provided through the insulating film extending to the contact portions 8a and 9a of the conductive sections 8 and 9.

In the semiconductor device according to the foregoing ninth and eleventh embodiments, the silicon nitride film is formed for the self-alignment contact in a blanket SiN method in the memory cell array section A, and the silicon nitride film is formed simultaneously in the peripheral circuit section B through which leads or so-called aluminum contacts from the upper layer are provided. More specifically, in the ninth embodiment, the size of the opening in the silicon nitride film is larger, with sufficient allowance, than the size of the conductive paths, i.e., than the size of the diameter of the aluminum contact holes. On the other hand, in the eleventh embodiment, the size of the opening of the silicon nitride film is same as the size of the conductive paths, i.e., the size of the diameter of the aluminum contact holes.

Twelfth Embodiment

Figure 26:
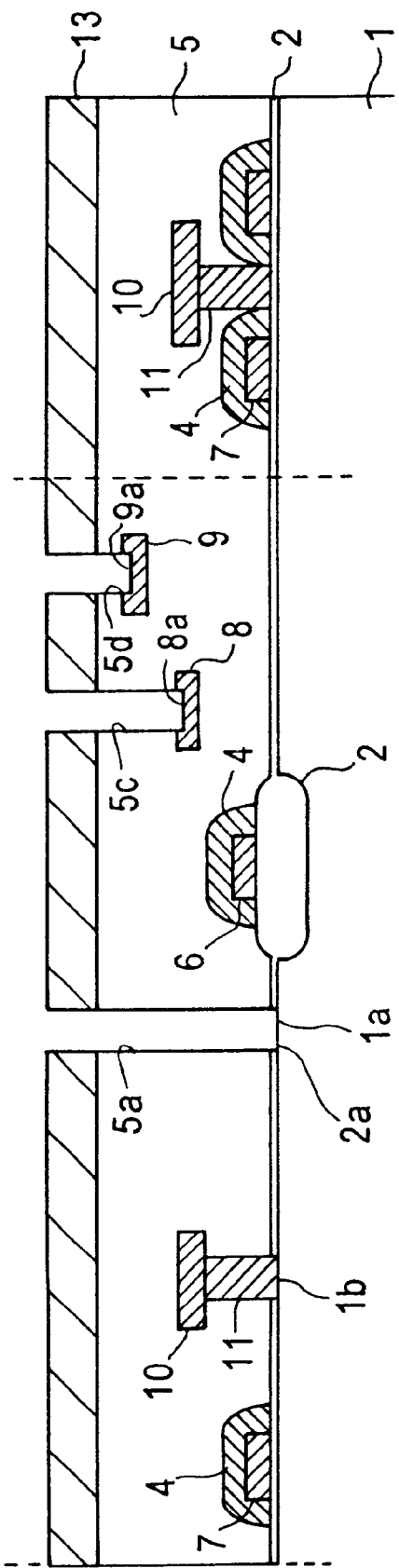
FIG. 26 through FIG. 28 are views for explaining a manufacturing method of a semiconductor device in accordance with the twelfth embodiment of the invention.
Figure 27:
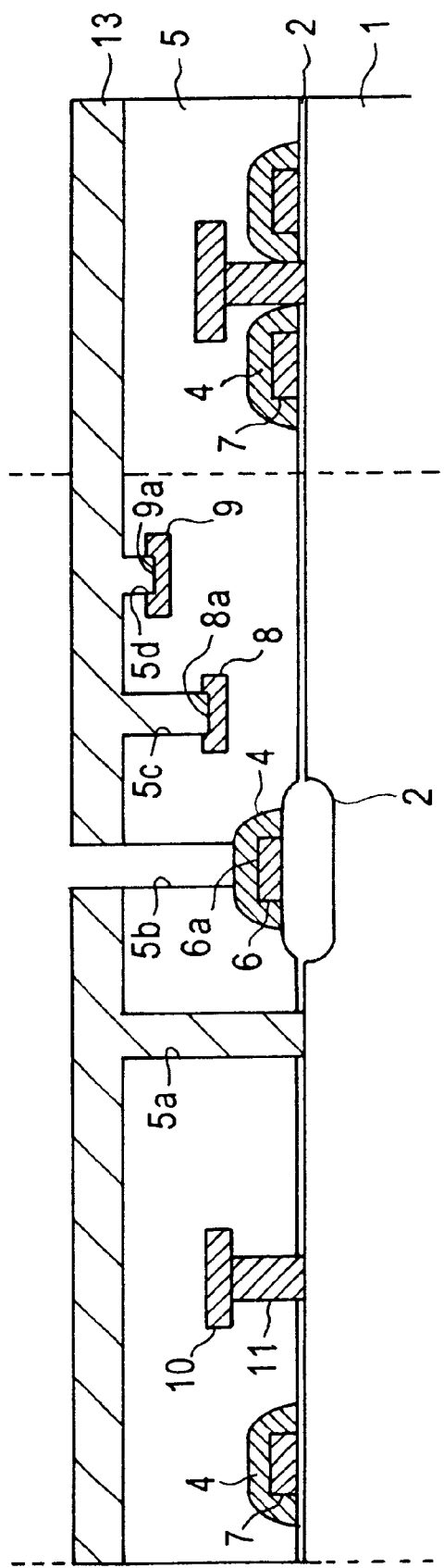
Figure 28:
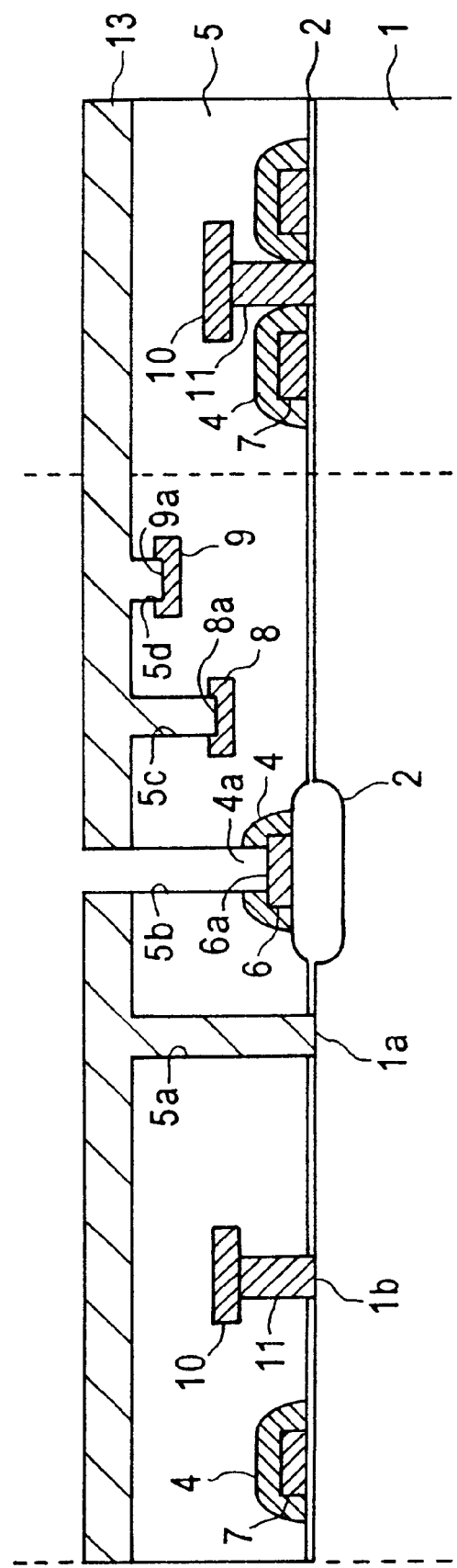
Figure 29:
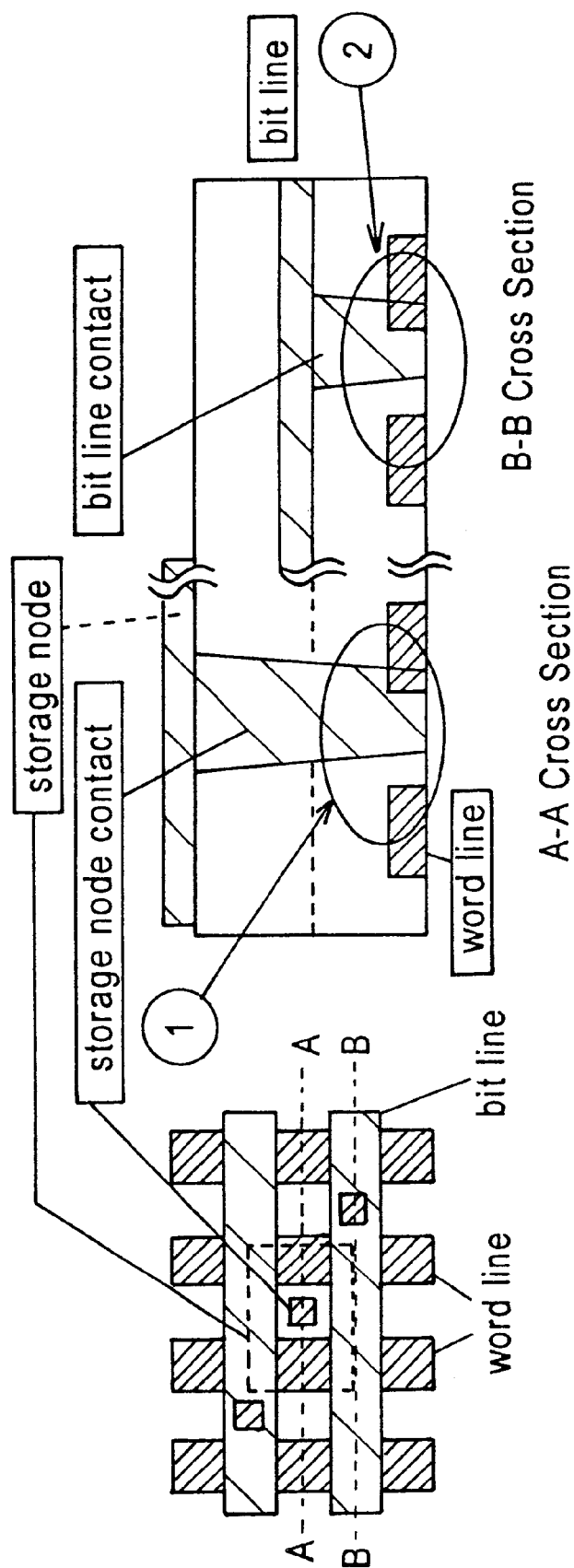
FIG. 29 is a view showing a conventional DRAM structure.
Figure 30A:
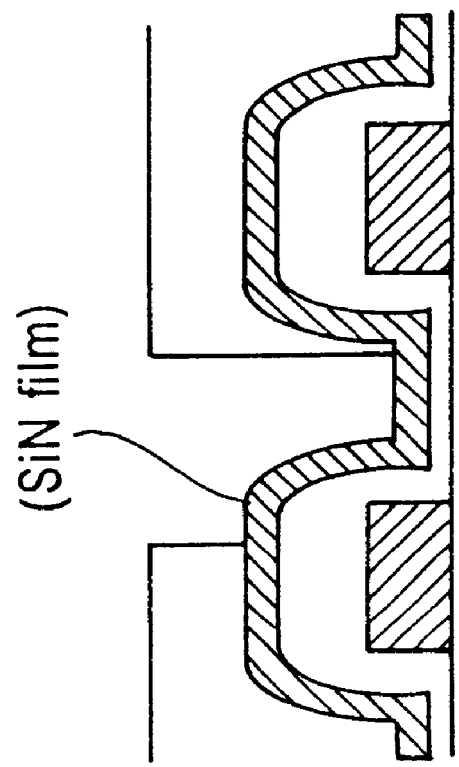
FIGS. 30A to 30B are views for explaining a self-alignment contact technology using silicon nitride film.
Figure 30B:
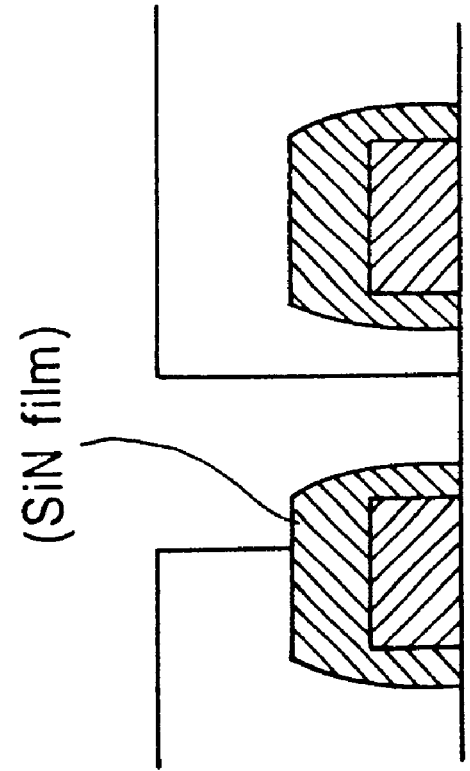
Figure 31A:
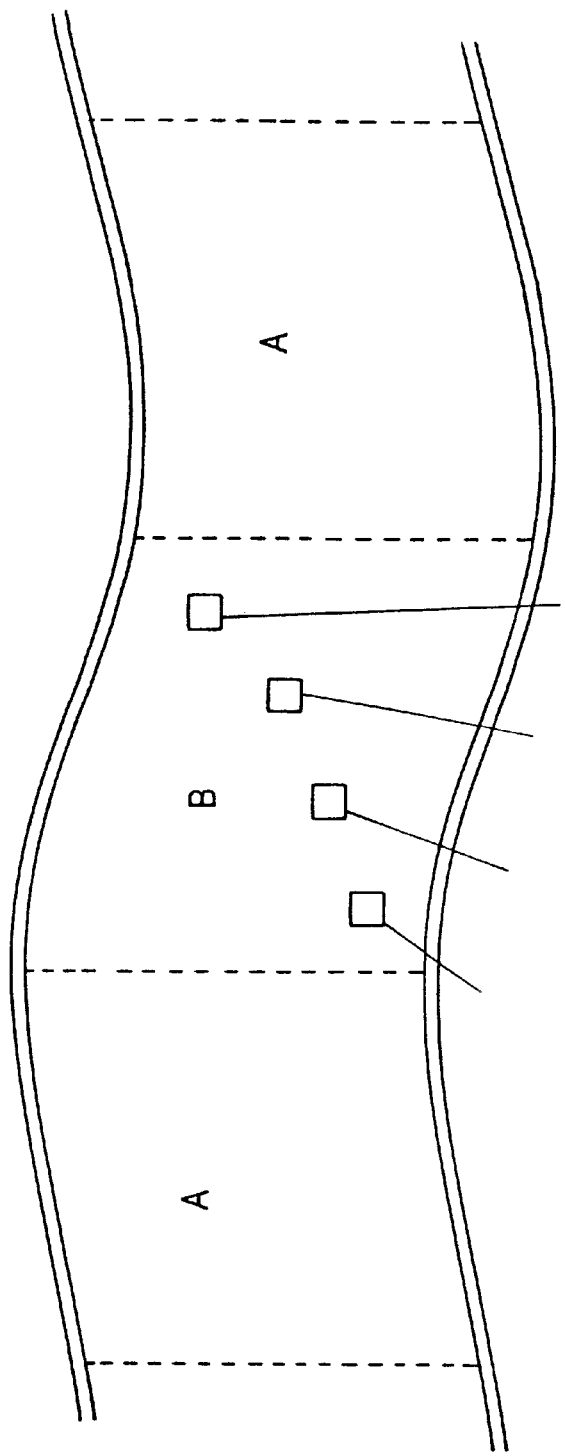
FIGS. 31A and 31B are views showing a state of conductive path (i.e. aluminum contact) provided through the interlayer insulating film.
Figure 31B:
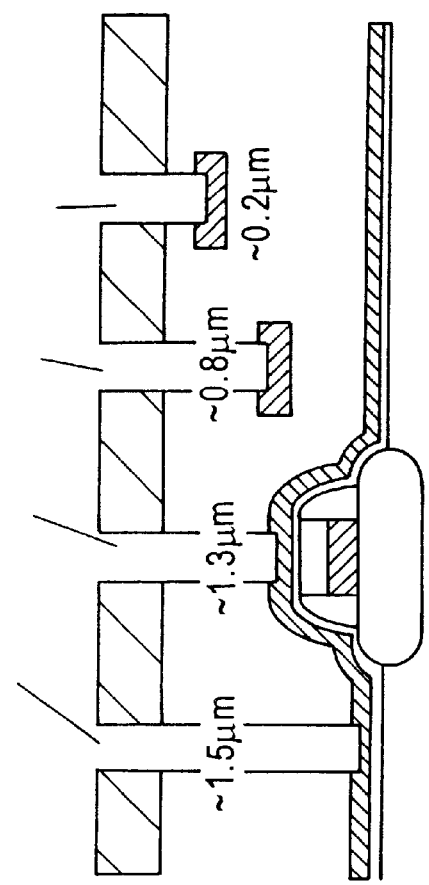

FIGS. 26 to 28 show a manufacturing process of a semiconductor device according to the twelfth embodiment of this invention, and this manufacturing process is suitable for manufacturing the semiconductor device of the structure as described in the eleventh embodiment. In the drawings, the same reference numerals as in FIG. 1 or FIG. 2 designate same or like parts.

Now the manufacturing process is described. As shown in FIG. 26, a first insulating film (oxide film) 2 is applied to the principal plane of the semiconductor substrate 1. On a part of this first oxide film 2, a conductive section (transfer gate) 6 and a conductive section (word line) 7 are formed so as to project from the first oxide film 2. Then, a silicon nitride film 4 is applied over the conductive section starting from the oxide film 2 along the surface and covering the conductive section 6. This process is achieved by applying first the silicon nitride film 4 to the entire surface of the first oxide film 2, and leaving the silicon nitride film 4 only around the conductive sections 6 and 7 while removing the silicon nitride film 4 by selective etching in all other parts. This silicon nitride film 4 is formed for self-alignment contact in the memory cell array section A, and is simultaneously formed also in the peripheral section B.

A third insulating film (silicon oxide film as interlayer insulating film) 5 is lastly applied to the entire surface of the first oxide film 2 and silicon nitride film 4. In this process, a bit line contact passage 11 is provided through the first oxide film 2 to the bit line contact portion 1b in the principal plane of the semiconductor substrate 1. Further, the conductive section (bit line) 8 and conductive section (bit line) 10 are disposed at the middle position with a certain distance from the principal plane of the semiconductor substrate 1. Furthermore, the conductive section (cell plate) 9 is buried in the interlayer oxide film 5.

Thereafter, a resist 13 is applied, and openings are provided at the locations of contact portions not covered with the silicon nitride film 4, i.e. the contact portion 1a of the semiconductor substrate 1, contact portion 8a of the bit line 8 and contact portion 9a of the cell plate 9. The interlayer oxide film 5 is etched selectively, and thereby openings extending to the contact portions 1a, 8a, 9a are formed.

Then, as shown in FIG. 27, the openings 5a, 5c and 5d extending to the contact portions 1a, 8a and 9a of the semiconductor substrate 1, bit line 8 and cell plate 9 respectively are filed or covered with the resist 13, and then an opening is formed at the location of the contact portion 6a of the conductive section covered with the silicon nitride film 4. Then, the interlayer oxide film 5 is etched selectively, and thereby an opening extending to the silicon nitride 4 is formed.

Subsequently, as shown in FIG. 28, from the opening 5b at the location of the contact portion 6a of the conductive section 6, the silicon nitride film 4 is etched, and thereby an opening reaching to the contact portion 6a is formed. Thereafter, the resist 13 is removed, and aluminum contacts are made in the interlayer oxide film 5 to serve as conductive paths to the upper parts through these openings.

This embodiment shows a manufacturing process in the SiN type self-alignment method in which the openings for aluminum contacts are made by etching in two steps using two masks. The process comprises a first opening step for the contacts on the substrate, bit line and cell plate which do not have a nitride film at the bottom of the opened hole, and second opening step for the contact on the transfer gate which has a nitride film at the bottom of the opened hole. In the first step, opening is performed just by dry etching of an oxide film, and in the second step, a dry etching of the oxide film is followed by a nitride film etching.

In this manner, since the steps of opening the contact holes are performed by separate etching for the holes with nitride film and without nitride film in the opened hole, it is possible to apply different etching specifications. Therefore a reduction in film thickness of upper leads or penetration of upper leads due to over-etching may be effectively prevented.

This embodiment may be also restated as follows. That is, in the manufacturing method according to this embodiment, an insulating film 2 is applied to the principal of the semiconductor substrate 1, and the conductive section 6 is formed on this insulating film 2. Then, the silicon nitride film 4 is applied to the conductive section 6, and another insulating film 5 is applied to the silicon nitride film 4. Next, openings are provided through the insulating film 2 and 5 to form a conductive path extending to the contact portion 1a of the semiconductor substrate 1. Then other openings are provided through the insulating film 5 and silicon nitride film 4 to form a conductive path extending to the contact portion 6a of the conductive section 6.

In the manufacturing process of a semiconductor device according to the foregoing tenth and twelfth embodiments, the silicon nitride film 4 is formed for self-alignment contact of SiN side wall method in the memory cell array section A, and the silicon nitride film 4 is formed simultaneously in the peripheral circuit section B, and so-called aluminum contacts are formed by providing leads from the upper layer through the silicon nitride film 4. More specifically, in the tenth embodiment, the silicon nitride film 4 is preliminarily removed at the region for making the aluminum contracts in the peripheral circuit section B, and then the interlayer oxide film 5 is applied thereto. Thereafter, the conductive paths, i.e., aluminum contacts are formed through the interlayer oxide film 5. On the other hand, in the twelfth embodiment, the interlayer oxide film 5 is applied to the silicon nitride film 4 also in the peripheral circuit section B, and then the conductive paths, i.e., aluminum contacts are formed through the interlayer oxide film 5 and silicon nitride 4.

Obviously, many modifications and variations of the present invention are possible in light of the above teachings. It is, therefore, to be understood that, within the scope of the appended claims, the invention may by practiced otherwise than as specifically described.

What is claimed is:

1. A manufacturing process of a semiconductor device comprising the steps of:

applying a first insulating film to a principal plane of a semiconductor substrate;

forming a conductive section having a contact portion on said first insulating film;

applying a second insulating film to said conductive section;

applying a silicon nitride film to said first and second insulating films;

removing a portion of said silicon nitride film leaving a remainder thereof extending over a predetermined portion of the principal plane of said semiconductor substrate;

covering an exposed portion of the first and second insulating films and the remainder of the silicon nitride film with a third insulating film;

forming a conductive path through said remainder of the silicon nitride film and said first insulating film to a principal plane of said semiconductor substrate; and forming a conductive path through said third insulating film to the contact portion of said conductive section.

2. A manufacturing process of a semiconductor device comprising the steps of:

applying a first insulating film to a principal plane of a semiconductor substrate;

forming a conductive section having upper and lower opposing surfaces and a contact portion, wherein the lower surface extends along and is in contact with the first insulating film;

forming an oxide second insulating film contacting and covering the upper surface of the conductive section;

applying a silicon nitride film to said first and second insulating films;

removing said silicon nitride film at least from a region above the contact portion of said conductive section and the remaining silicon nitride film is on the side surfaces of said conductive section to selectively expose the surface of the first insulating film;

covering the selectively exposed surface of said first insulating film and a remaining portion of the silicon nitride film with a third insulating film; and forming a conductive path through said third insulating film to the contact portion of said conductive section.

3. A manufacturing process of a semiconductor device comprising the steps of:

applying an insulating film to a principal plane of a semiconductor substrate having a plurality of first contact portions;

forming a conductive section having a second contact portion on said insulating film, wherein said conductive section has a top surface and a side surface;

covering said insulating film and said conductive section with a silicon nitride film;

removing said silicon nitride film from said insulating film, and the remaining said silicon nitride film covering only the top surface and the side surface of said conductive section;

covering said silicon nitride film and said insulating film with another insulating film;

forming a conductive path through said another insulating film and said silicon nitride film to the second contact portion of said conductive section; and forming a second conductive path through said insulating film and said another insulating film to one of the plurality of first contact portions of said semiconductor substrate.

* * * * *

UNITED STATES PATENT AND TRADEMARK OFFICE
CERTIFICATE OF CORRECTION

PATENT NO.   : 6,573,171 B2
DATED        : June 3, 2003
INVENTOR(S)  : Takahisa Eimori et al.

It is certified that error appears in the above-identified patent and that said Letters Patent is hereby corrected as shown below:

<u>Title page,</u>
Insert Item -- [73] Assignee Mitsubishi Denki Kabushiki Kaisha, Tokyo, Japan --

Signed and Sealed this

Fifth Day of April, 2005

JON W. DUDAS
*Director of the United States Patent and Trademark Office*